(12) United States Patent
Vieluf

(10) Patent No.: US 10,837,098 B2
(45) Date of Patent: Nov. 17, 2020

(54) METHOD AND COATING ARRANGEMENT

(71) Applicant: VON ARDENNE Asset GmbH & Co. KG, Dresden (DE)

(72) Inventor: Maik Vieluf, Moritzburg (DE)

(73) Assignee: VON ARDENNE ASSET GMBH & CO. KG, Dresden (DE)

( * ) Notice: Subject to any disclaimer, the term of this patent is extended or adjusted under 35 U.S.C. 154(b) by 0 days.

(21) Appl. No.: 16/445,254

(22) Filed: Jun. 19, 2019

(65) Prior Publication Data

US 2019/0301003 A1 Oct. 3, 2019

Related U.S. Application Data

(63) Continuation of application No. 15/569,409, filed as application No. PCT/EP2016/059282 on Apr. 26, 2016.

(30) Foreign Application Priority Data

Apr. 30, 2015 (DE) .................... 10 2015 106 811

(51) Int. Cl.
*C23C 14/34* (2006.01)
*C23C 14/06* (2006.01)
(Continued)

(52) U.S. Cl.
CPC ...... *C23C 14/0605* (2013.01); *C23C 14/0635* (2013.01); *C23C 14/0641* (2013.01);
(Continued)

(58) Field of Classification Search
CPC .............................. C23C 14/56; C23C 14/562
See application file for complete search history.

(56) References Cited

U.S. PATENT DOCUMENTS

| 5,024,721 A | 6/1991 | Yamagata |
| 2004/0126663 A1 | 7/2004 | Sudano et al. |

(Continued)

FOREIGN PATENT DOCUMENTS

| JP | H03082747 A | 4/1991 |
| JP | H05314985 A | 11/1993 |

(Continued)

OTHER PUBLICATIONS

Notice of Reasons for Refusal issued for the corresponding JP-application No. 019-073965, dated Mar. 3, 2020, 5 pages (for informational purpose only).

(Continued)

*Primary Examiner* — Jason Berman
(74) *Attorney, Agent, or Firm* — Viering, Jentschura & Partner MbB

(57) ABSTRACT

Herein is disclosed a process comprising transporting of a foil structure in a coating region in a vacuum chamber, wherein the foil structure has a thickness of less than 40 μm; and coating the foil structure with a protective layer using a gaseous coating material; wherein the gaseous coating material comprises a metal; applying an active material on the foil structure to form a first electrode which has a first chemical potential; assembling the first electrode with a second electrode, where the second electrode has a second chemical potential; and encapsulating the first electrode and the second electrode.

20 Claims, 11 Drawing Sheets

(51) Int. Cl.
- *H01M 4/66* (2006.01)
- *H01M 4/13* (2010.01)
- *C23C 14/24* (2006.01)
- *C23C 14/56* (2006.01)
- *C23C 14/14* (2006.01)
- *C23C 14/30* (2006.01)
- *C23C 14/02* (2006.01)

(52) U.S. Cl.
CPC ............. *C23C 14/14* (2013.01); *C23C 14/24* (2013.01); *C23C 14/30* (2013.01); *C23C 14/34* (2013.01); *C23C 14/56* (2013.01); *C23C 14/562* (2013.01); *H01M 4/13* (2013.01); *H01M 4/663* (2013.01); *H01M 4/667* (2013.01); *C23C 14/021* (2013.01)

(56) References Cited

U.S. PATENT DOCUMENTS

| | | |
|---|---|---|
| 2004/0241549 A1 | 12/2004 | Cho et al. |
| 2005/0064214 A1* | 3/2005 | Hultin Stigenberg ............... C23C 14/022 428/469 |
| 2009/0029251 A1 | 1/2009 | Baba |
| 2011/0200884 A1 | 8/2011 | Uchida |
| 2012/0040233 A1* | 2/2012 | Kim ............ C23C 14/562 429/152 |
| 2012/0187000 A1* | 7/2012 | Kahn ............ G01N 27/3335 205/782 |
| 2015/0072084 A1 | 3/2015 | Mimoun et al. |

FOREIGN PATENT DOCUMENTS

| | | |
|---|---|---|
| JP | 2002170772 A | 6/2002 |
| JP | 2004356082 A | 12/2004 |
| JP | 2005183365 A | 7/2005 |
| JP | 2006512722 A | 4/2006 |
| JP | 2008270092 A | 11/2008 |
| JP | 2009259634 A | 11/2009 |
| JP | 2010118258 A | 5/2010 |
| JP | 2015523459 A | 8/2015 |
| KR | 100515301 A | 12/2004 |
| WO | 2007102433 A1 | 7/2009 |
| WO | 2009127920 A1 | 10/2009 |
| WO | 2013156721 A1 | 10/2013 |

OTHER PUBLICATIONS

Japanese Search Report issued for the corresponding JP-application No. 2019-073965, dated Feb. 7, 2020, 25 pages (for informational purpose only).

* cited by examiner

METHOD AND COATING ARRANGEMENT

CROSS-CITING TO RELATED APPLICATIONS

The present application is a continuation application of U.S. National Phase application Ser. No. 15/569,409, which was filed on Oct. 26, 2017, which claims priority to International PCT Application PCT/EP2016/059282, which was filed on Apr. 26, 2016, which claims priority to German Application 10 2015 106 811.7, which was filed on Apr. 30, 2015, each of which is fully incorporated herein by reference.

TECHNICAL FIELD

The disclosure relates to a process and a coating arrangement.

BACKGROUND

If materials such as metals (e.g. steel) or components made of these materials are exposed to corrosive environmental conditions, e.g. as a result of acids/bases and/or as a result of an electric voltage, they can be attacked by the corrosive environmental conditions, which can lead to impairment of their function. However, some materials form an inert (sluggishly reacting) passivating layer which inhibits, i.e. slows or prevents, corrosion of the material underneath. These materials can be used in a targeted manner in order to increase the chemical resistance of components to corrosive environmental conditions as occur, for example, in batteries or rechargeable batteries. For example, a material having a suitable composition can have been or be provided (e.g. by mixing chromium into it) so that a stable passivating layer (e.g. an oxide layer such as chromium oxide) is automatically (naturally) formed on the material. However, the passivating layer at the same time impairs the electrical conductivity on the surface of the material or of the component. In other words, the surface resistance thereof is increased by the passivating layer and electrical contacting of the material or component is therefore made more difficult.

In the case of materials or components which are used in electrical appliances (e.g. energy storages such as rechargeable batteries, batteries or capacitors) and are employed, for example, for contacting or for conducting the electric current, the provision of an electrical contact (i.e. illustratively a low interfacial resistance) can require a low surface resistance in order to reduce resistive losses and thus impairment of the efficiency. For this reason, the natural passivating layer is frequently replaced by a synthetically produced electrically conductive protective layer which inhibits corrosion but has a lower surface resistance compared to the natural passivating layer.

In the case of thin foils (e.g. thinner than 200 microns) which are required, for example, for use in electrodes, e.g. metal foils composed of copper or aluminum, most of the conventional processes for producing synthetic protective layers lead to damage to the foils, since their mechanical strength is greatly reduced by the low thickness. Thin foils are illustratively very sensitive and cracks or holes can remain in the foil.

Processes which avoid damage to the foils customarily utilize a wet-chemical deposition method in which particles (e.g. flocs or microparticles having sizes in the micron range) are dispersed in an organic solvent and applied together with the organic solvent to the foil. The solvent is subsequently vaporized by means of heat, so that the particles remain and form a protective layer. However, the organic solvent can, in this case, react chemically with the foil so as to form an electrically insulating layer between the protective layer and the foil, which inhibits the flow of current and thus restricts the ability of wet-chemical deposition methods to reduce the surface resistance.

In addition, no chemical bonds are formed between the particles and the surface of the foils (these adhere, for example, only by means of van der Waals interactions, which are weak chemical bonds), as a result of which both the electrical and mechanical properties of the protective layer (e.g. adhesion of this to the foil) are impaired. In other words, the protective layers formed by particles cannot be loaded mechanically and are easily damaged, which leads to corrosion of the underlying foil. Modern energy storages which provide high electrical (cell) voltages (e.g. greater than 4 V) require electrodes having a high chemical resistance.

For example, carbon is customarily applied in particle form to the foils. However, the layer thicknesses which can be achieved by this method are in the range of microns ($\mu$m), i.e. these are illustratively very thick. Since the ohmic resistance of the layer increases with increasing layer thickness, the interfacial resistances (ICR=interfacial contact resistance, also referred to as interfacially induced resistances) generated thereby result in large resistive losses and thus impair the efficiency.

As an alternative, carbon is applied in floc form (known as "carbon flakes") to the foils. In this way, it is possible to achieve significantly smaller layer thicknesses, e.g. a few nanometers (nm), which reduces resistive losses. However, a porous layer which has many openings at which the foil is exposed is produced thereby. There are illustratively regions of the foil on which there are no flocs to protect the foil against corrosion. The exposed regions can be corroded further by further wet-chemical manufacturing processes, e.g. during application of active materials for electrodes (anodes or cathodes) in rechargeable batteries, as a result of which the interfacial resistance is increased, e.g. by oxide formation.

SUMMARY

According to various embodiments, a process for working thin foil structures, e.g. metal foils or polymer films (e.g. metal-coated polymer films) is illustratively provided, with an electrically conductive protective layer, i.e. illustratively a corrosion-resistant contact layer, being able to be applied to the foil structure by means of the process. Furthermore, according to various embodiment, it can be advantageous to remove an existing surface layer (e.g. an oxide layer) from the foil structure before formation of the protective layer in order to increase the adhesion (the adhesive capability) and electrical contact of the protective layer to the foil structure.

According to various embodiments, a process which illustratively allows a high throughput is provided, so that long foil structures (e.g. strips, e.g. longer than 10 m) can be coated in an economical way.

In various embodiments, a buffer layer which illustratively improves the adhesion of the protective layer to the foil structure is optionally provided. In other words, the buffer layer acts as bonding agent. The buffer layer can be arranged between the foil structure and the protective layer. The protective layer can then have or form an exposed surface.

In various embodiments, a vacuum-based process (e.g. for optionally one-sided or two-sided) deposition of amorphous carbon (a-C from the group consisting of DLC, diamond-like carbon) is provided. This process can, for example be applied to thin aluminum foils (Al foils) or copper foils (Cu foils) or other foils having a metal surface, e.g. to metallically upgraded polymer films. According to various embodiments, one or more corrosion-resistant and electrically conductive layers (i.e. a layer system) having a low surface contact resistance are provided by means of the process.

In various embodiments, a process for producing thin, corrosion-resistant and electrically conductive foil structures having a low surface contact resistance for use as current collectors and/or power outlet leads for energy storages, e.g. for lithium ion batteries, is provided.

In various embodiments, a closed protective layer having a particularly small layer thickness is illustratively provided. Since the ohmic resistance is proportional to the layer thickness, the surface resistance is, for example, up to a factor of 10 lower than in the case of conventional protective layers, which increases the efficiency.

A process according to various embodiments can include the following: transporting of a foil structure (e.g. a foil) into a coating region in a vacuum chamber, with the foil structure having a thickness of less than 40 µm; and coating of the foil structure using a gaseous coating material.

In various embodiments, a coating including one or more layers can have been or be formed using the gaseous coating material (e.g. from the gaseous coating material). In other words, coating can involve formation of a coating (including one or more layers) using the gaseous coating material (e.g. from the gaseous coating material).

In various embodiments, the foil structure (e.g. the foil) can have a thickness (i.e. transverse to the lateral extension of the foil structure), which is less than 40 µm, e.g. less than about 35 µm, e.g. less than about 30 µm, e.g. less than about 25 µm, e.g. less than about 20 µm, e.g. less than about 15 µm, e.g. less than about 10 µm, e.g. less than about 5 µm, e.g. in the range from about 10 µm to about 30 µm, e.g. about 20 µm or, for example, about 25 µm.

In various embodiments, the foil structure can include a laminate made up of at least one polymer and at least one metal. For example, the foil structure can include or be formed by a metal-coated (e.g. on one or both sides) polymer film. As an alternative, the foil structure can be formed by the metal. In other words, the foil structure can, for example, be a metal foil. As an alternative, the foil structure can be formed by the polymer. In other words, the foil structure can, for example, be a polymer film.

In the context of the present description, a metal (also referred to as metallic material) can include (or be formed by) at least one metallic element (i.e. one or more metallic elements), e.g. at least one element from the following group of elements: copper (Cu), iron (Fe), titanium (Ti), nickel (Ni), silver (Ag), chromium (Cr), platinum (Pt), gold (Au), magnesium (Mg), aluminum (Al), zirconium (Zr), tantalum (Ta), molybdenum (Mo), tungsten (W), vanadium (V), barium (Ba), indium (In), calcium (Ca), hafnium (Hf), samarium (Sm), silver (Ag) and lithium (Li). Furthermore, a metal can include or be formed by a metallic compound (e.g. an intermetallic compound or an alloy), e.g. a compound of at least two metallic elements (e.g. from the group of elements), e.g. bronze or brass, or, for example, a compound of at least one metallic element (e.g. from the group of elements) and at least one nonmetallic element, e.g. steel.

Furthermore, a metal, e.g. the metal of the foil structure, and/or the foil structure can have a thermal conductivity of greater than 10 W/(m·K), e.g. greater than 50 W/(m·K).

The metal of the foil structure can illustratively form a metal surface of the foil structure. In other words, the foil structure can have a metal surface. Some metals naturally form a passivating layer, but this increases the surface resistance and/or impairs the adhesion of the protective layer. In various embodiments, the passivating layer can be removed, so that the surface resistance of the foil structure can be reduced.

For this purpose, the process according to various embodiments can further include: removal of a surface layer (e.g. at least the passivating layer) of the foil structure (e.g. before coating) to at least partly expose the metal of the foil structure, so that a (for example exposed) metallic surface (e.g. a metal surface) is formed. As a result, a surface which is present in a metallic microstructure, i.e., for example, is substantially free of oxygen, carbon or other materials or nonmetallic compounds (e.g. oxides, organics, etc.), can be formed. A coating, e.g. a layer, can then be formed on the exposed metallic surface by the coating operation.

The surface layer can have a thickness (layer thickness) of less than about 1 µm, e.g. less than about 500 nm, e.g. less than about 250 nm, e.g. less than about 100 nm, e.g. less than about 50 nm, e.g. less than about 25 nm, e.g. less than about 10 nm, e.g. less than about 5 nm, e.g. in the range from about 10 nm to about 100 nm.

The removal of the surface layer can be carried out using a plasma, i.e. by means of what is known as plasma etching. For example, the plasma can be generated using the gaseous coating material or another gaseous coating material (known as plasma activated deposition). If, for example, sputtering is employed, the plasma can have been or be provided naturally (intrinsically) by the sputtering process. If, for example, electron beam evaporation is used, a plasma can be ignited at the vaporization point of the electron beam (i.e. at the place at which the electron beam impinges on the target) using an anode. The anode can, for example, be arranged in the vicinity of the vaporization point.

As an alternative or in addition, the plasma can be generated using a working gas and/or a reactive gas. The plasma can act on the surface layer of the foil structure and remove this by, for example, formation of a volatile material (e.g. by chemical reaction) with the material of the surface layer and/or by atomization of the material of the surface layer.

As an alternative or in addition, the removal of the surface layer can be carried out using an ion beam, i.e. by means of ion bombardment of the foil structure. The ion beam can have been or be provided by means of an ion gun and have been or be directed on to the foil structure. The ion beam can atomize the material of the surface layer. The ion beam can, for example, include or be formed by argon ions or nitrogen ions.

As an alternative or in addition, ion bombardment can be carried out during coating of the foil structure. Thus, for example, nitrogen can be introduced into the layer, so that nitride formation occurs. For example, a layer including metal nitride can be formed using an ion beam.

In various embodiments, the gaseous coating material (also referred to as material vapor) can include a metal (e.g. Ni, Ti or Cr) or carbon.

In various embodiments, the gaseous coating material can include at least carbon or be formed thereby, e.g. have a major proportion of carbon, e.g. more than about 50%, e.g. more than about 60%, e.g. more than about 70%, e.g. more than about 80%, e.g. more than about 90%, e.g. about 100%. For example, the gaseous coating material can have been or be formed using a carbon target. When the gaseous coating material which includes at least carbon or is formed thereby is used, a protective layer including carbon, e.g. a major proportion of carbon, e.g. more than about 50%, e.g. more than about 60%, e.g. more than about 70%, e.g. more than about 80%, e.g. more than about 90%, e.g. about 100%, can have been or be formed.

For example, the protective layer can include or be formed by carbon in the form of graphite, nanocrystalline graphite, amorphous carbon, tetrahedral carbon and/or tetrahedral-amorphous carbon (ta-C). Tetrahedral-amorphous carbon can, for example, include more than 70% of sp3-hybridized carbon.

In various embodiments, the gaseous coating material can include or be formed by at least one metal (e.g. nickel, titanium and/or chromium), e.g. have a major proportion of metal, e.g. more than about 50%, e.g. more than about 60%, e.g. more than about 70%, e.g. more than about 80%, e.g. more than about 90%, e.g. about 100%. For example, the gaseous coating material can have been or be formed using a metal target. When the gaseous coating material which includes or is formed by at least one metal is used, a protective layer including metal, e.g. has a major proportion of metal, e.g. more than about 50%, e.g. more than about 60%, e.g. more than about 70%, e.g. more than about 80%, e.g. more than about 90%, e.g. about 100%, can have been or be formed.

In various embodiments, the gaseous coating material can include or be formed by at least nickel, titanium and/or chromium. For example, the gaseous coating material can include or be formed by nickel and chromium. When the gaseous coating material including or formed by at least nickel and chromium is used, a nickel-chromium layer (NiCr layer), for example, can have been or be formed.

For example, the gaseous coating material can include or be formed by titanium. When the gaseous coating material including or formed by at least titanium is used, a titanium layer, for example, can have been or be formed.

In various embodiments, the process can further include: coating of the foil structure using a further gaseous coating material. In various embodiments, a first layer can have been or be formed using the gaseous coating material (e.g. from the gaseous coating material), and a second layer can have been or be formed using the further (in other words the additional) gaseous coating material (e.g. from the further gaseous coating material).

As an alternative, a joint layer can have been or be formed using the gaseous coating material and the further gaseous coating material (e.g. from the gaseous coating material and from the further gaseous coating material), with the gaseous coating material and the further gaseous coating material being at least partially mixed with one another. In other words, a mixture of vapors of materials can be used.

For example, the gaseous coating material and the further gaseous coating material can be at least partially (i.e. partially or completely) mixed with one another in such a way that a composition gradient is formed transverse to the foil structure in the joint layer.

For example, a mixture (e.g. carbon/metal mixture) which changes over time of the gaseous coating material and the further gaseous coating material can be used for forming the joint layer, so that the layers deposited on top of one another can have a different chemical composition (in the depth profile). As an alternative, a mixture (e.g. carbon/metal mixture) which changes over space of the gaseous coating material and the further gaseous coating material can be used for forming the joint layer, so that the layers deposited on top of one another can have a different chemical composition.

In various embodiments, a coating or layer (e.g. the first layer and/or the second layer or the joint layer) can include carbon, e.g. the layer can have a proportion of carbon of more than about 30 at-% (atom percent, corresponds to the molar proportion), e.g. more than about 50 at-%, e.g. more than about 70 at-%, e.g. more than about 90 at-%. As an alternative, the layer can have a proportion of carbon in the range from about 30 at-% to about 90 at-%. The proportion of carbon in the layer can be a spatially averaged proportion of carbon.

In various embodiments, a coating or layer (e.g. the first layer and/or the second layer or the joint layer) can include a metal, e.g. the layer can have a proportion of metal of more than about 30 at-% (atom percent, corresponds to the molar proportion), e.g. more than about 50 at-%, e.g. more than about 70 at-%, e.g. more than about 90 at-%. As an alternative, the layer can have a proportion of metal in the range from about 30 at-% to about 90 at-%. The proportion of metal in the layer can be a spatially averaged proportion of metal.

In various embodiments, a coating or layer (e.g. the first layer and/or the second layer or the joint layer) can include a metal and carbon, e.g. the layer can have a proportion of metal/carbon (i.e. the summated proportion of carbon and metal) of more than about 30 at-% (atom percent, corresponds to the molar proportion), e.g. more than about 50 at-%, e.g. more than about 70 at-%, e.g. more than about 90 at-%. As an alternative, the layer can have a proportion of metal/carbon in the range from about 30 at-% to about 90 at-%. The proportion of metal/carbon in the layer can be a spatially averaged proportion of metal/carbon. The ratio of metal to carbon in the proportion of metal/carbon can be in the range from about 1 at-% to about 99 at-%, e.g. in the range from about 10 at-% to about 90 at-%, e.g. in the range from about 20 at-% to about 80 at-%, e.g. in the range from about 30 at-% to about 70 at-%, e.g. in the range from about 40 at-% to about 60 at-%, or alternatively, for example, in the range from about 10 at-% to about 40 at-%, e.g. in the range from about 20 at-% to about 40 at-%, e.g. in the range from about 30 at-% to about 40 at-%, or alternatively, for example, in the range from about 60 at-% to about 90 at-%, e.g. in the range from about 70 at-% to about 90 at-%, e.g. in the range from about 80 at-% to about 90 at-%.

A composition gradient in a layer (e.g. the joint layer or a buffer layer), i.e. a gradient in the proportion of a constituent (e.g. carbon or metal) in a layer, can be a gradient in the composition of the layer, or a gradient in the concentration of the constituent in the layer, or a gradient in the density of the layer or a materials gradient along one direction. In other words, the layer can, for example, be configured as a layer with a gradient. For example, the gradient can be greatest along a direction perpendicular to the joint contact interface between layer and foil structure, e.g. along a direction perpendicular to the surface of the layer or of the foil structure, or perpendicular to the thickness direction of the layer.

Coating can optionally be carried out in such a way that the coating, e.g. the layer, can have a gradient in the proportion of carbon (in the carbon content) and/or of the metal. For example, the gradient of the carbon content and/or the gradient of the metal content can have a relative deviation from the spatially averaged (average) proportion of carbon or spatially averaged proportion of metal in the coating, e.g. the layer, of more than 10 at-%, e.g. more than 30 at-% or 50 at-%. For example, coating can be carried out in such a way that the proportion of carbon in the coating, e.g. the layer, is smallest at the joint contact interface between coating and foil structure (e.g. in the range from about 0 at-% to about 30 at-%) and can increase along a direction perpendicular to the joint contact interface between coating and foil structure (e.g. continuously, e.g. monotonically).

As an alternative or in addition, the coating, e.g. the joint layer (e.g. a layer admixed with metal), can have a gradient in the proportion of the metal (e.g. perpendicular to the joint contact interface between coating and foil structure), with the mechanical voltage in the coating being able to be decreased continually along the gradient in the proportion of metal. The proportion of metal in the coating can illustratively be greatest at the joint contact interface between coating and foil structure (e.g. in the range from about 70 at-% to about 100 at-%), with the adhesion capability of the coating to the foil structure being able to be increased (e.g. compared to a coating deposited directly without metal on the foil structure).

A composition gradient, e.g. a gradient in the proportion of the metal, in the coating, e.g. in a layer, can optionally be produced by, for example, the coating being applied in two layers (consisting of sublayers arranged on top of one another), with, for example, one sublayer being able to be a metal layer and one sublayer being able to be a carbon layer, the two of which being able to have a joint contact interface. For example, a region between the carbon layer and the metal layer (e.g. the joint contact interface) can include a mixture of carbon and the metal, so that a continual transition in the chemical composition from carbon to metal can occur, i.e. a composition gradient is formed.

For example, coating (i.e. formation of the coating) can be effected in a multilayer manner (in a plurality of layers having a respective layer thickness and a respective chemical composition of the individual layers) by, for example, at least one layer of metal (metal layer) and at least one layer of carbon (carbon layer) being deposited on the foil structure. Illustratively, a prescribed proportion of carbon can be set, for example, by means of the ratio of the thickness of the metal layer to the thickness of the carbon layer. A ratio of metal to carbon in the proportion of metal/carbon in the layer, i.e. the composition thereof, can have been or be defined thereby.

A gradient in the proportion of the metal can optionally be produced by, for example, applying a carbon/metal mixture which can at least partially demix on heating and cooling of the layer.

The second layer can, according to various embodiments, have been or be formed between the first layer and the foil structure, i.e. as a buffer layer. In this case, the first layer can serve as protective layer or contact layer (i.e. as electrically conductive protective layer). As an alternative, the first layer can also have been or be formed between the second layer and the foil structure, i.e. as buffer layer. In this case, the second layer can serve as protective layer or contact layer (i.e. as electrically conductive protective layer).

The buffer layer can, according to various embodiments, include or be formed by a metal. The buffer layer can optionally include or be formed by a metal nitride and/or a metal carbide. In this way, for example, the mechanical stresses in the coating (e.g. at the joint contact interface between the coating and the foil structure) arising during coating (e.g. by formation of a further layer) of the foil structure can be reduced. For example, the buffer layer can be applied as appropriate metal or appropriate carbon/metal mixture. The buffer layer can illustratively be configured as bonding agent for bonding the protective layer to the foil structure. For example, a buffer layer can be configured as gradient layer (having a composition gradient), as described above, to act as bonding agent. The buffer layer can illustratively be arranged in direct contact with the foil structure (between the foil structure and the layer), with the metal of the foil structure.

In various embodiments, the process can further include production of energy pulses for heating the coating (e.g. the first layer and/or the second layer or the joint layer), so that this is structurally altered.

For example, the generation of energy impulses for irradiating the layer can be carried out using at least one radiation source which is operated in pulses, e.g. at least one light source (e.g. at least one laser, at least one lamp, at least one flashgun or at least one light-emitting diode) or a plurality of light sources, with the layer being able to be illuminated in pulses by means of the energy impulses for irradiating the layer.

Furthermore, according to various embodiments, the production of energy impulses for irradiating the layer can be carried out using a continuously operated radiation source, where the energy impulses emitted by means of the continuously operated irradiation source for irradiating the layer can be directed (e.g. by means of mirrors, lenses, deflectors and/or electric/magnetic fields) on to the layer in such a way that a region of the layer can in each case be irradiated briefly, so that pulsed irradiation illustratively occurs.

For example, the generation of energy impulses for irradiating the layer can be carried out with a pulse duration of in each case up to 10 ms. For example, the pulse duration of the energy impulses for irradiating the layer can be shorter than 1 ms, e.g. shorter than 0.1 ms or shorter than 100 µs. As an alternative, the energy impulses for irradiating the layer can have a duration (impulse duration) in the range from about 10 µs to about 10 ms, e.g. in the range from about 100 µs to about 1 ms, e.g. in the range from about 200 µs to about 500 µs.

In various embodiments, the generation of the energy impulses for irradiating the layer can occur with a repetition rate of more than 0.1 Hz, e.g. at more than 1 Hz. For example, the generation of the energy impulses for irradiating the layer can be carried out with a repetition rate in a range from about 10 Hz to about 0.1 Hz. In one embodiment, the at least one irradiation apparatus can have at least one irradiation source operated in a pulsed manner.

In various embodiments, the generation of energy impulses for irradiating the layer can be effected in such a way that the layer can be heated to more than 400° C. for less than 1 s. For example, the energy impulses for irradiating the layer can be generated with a spectral distribution and power so that the energy impulses for irradiating the layer can be at least partially absorbed by the layer.

In various embodiments, the production of gaseous coating material, or the formation of a layer, can be carried out by means of physical vapor deposition (PVD), e.g. by means of cathode atomization (known as sputtering) or by means of electron beam vaporization (E-beam) or another vaporization technique, as described in more detail below.

In various embodiments, coating of the foil structure can include formation of a contiguous microstructure which covers at least a major part of the foil structure, e.g. more than about 50%, e.g. more than about 60%, e.g. more than about 70%, e.g. more than about 80%, e.g. more than about 90%, e.g. in the range from about 60% to about 100%, e.g.

in the range from about 70% to about 100%, e.g. in the range from about 80% to about 100%. As an alternative or in addition, coating of the foil structure can include forming a microstructure having strong chemical bonds to the foil structure. For the purposes of the present disclosure, strong chemical bonds are covalent bonds, ionic bonds and/or metallic bonds. For example, the layer can for this purpose be in physical contact with the metal of the foil structure and/or have undergone a chemical bond with this (e.g. a reaction layer can form at the interface between the layer and the metal of the foil structure).

In various embodiments, a microstructure can be considered to be a compound composed of one or more chemical elements (i.e. one material or mixture of materials) and characterized by characteristic physical and chemical properties. The constituents of the microstructure (e.g. crystallites, grains, fillers and amorphous regions) can be microscopically small and have a spatial distribution. A microstructure can have a geometric spatial filling, i.e. the ratio of bulk density to true density, of more than about 50%, e.g. more than about 60%, e.g. more than about 70%, e.g. more than about 80%, e.g. more than about 90%, e.g. about 100%. In other words, the microstructure can have a fraction of pores or voids of less than about 50%, e.g. less than about 40%, e.g. less than about 30%, e.g. less than about 20%, e.g. less than about 10%, e.g. less than about 5%, based on the total volume (e.g. of a coating). Illustratively, the microstructure is then substantially free of pores or voids.

In various embodiments, the process can further include the following: application of an active material (can also be referred to as electrode material) to the foil structure (e.g. to the coating, i.e., for example, to the first layer and/or the second layer or the joint layer) to form a first electrode which has a first chemical potential; assembly of the first electrode with a second electrode, where the second electrode has a second chemical potential; encapsulation of the first electrode and the second electrode.

In various embodiments, the process can further include: formation of a contact for contacting the foil structure of the first electrode. In other words, the contact can contact the foil structure of the first electrode. The process can optionally further include: formation of a further contact for contacting the second electrode.

In various embodiments, the process can further include: formation of an electrolyte between the first electrode and the second electrode to provide an ion-exchange connection between the first electrode and the second electrode.

An electrolyte can include at least one of the following: salt (e.g. $LiPF_6$ (lithium hexafluorophosphate), $LiBF_4$ (lithium tetrafluoroborate)), water-free aprotic solvent (e.g. ethylene carbonate, diethyl carbonate, etc.), LiBOB (lithium bis(oxalato)borate), polyvinylidene fluoride (PVDF), polyvinylidene fluoride-hexafluoropropene (PVDF-HFP), $Li_3PO_4N$ lithium phosphate nitride.

The second electrode can have been or be formed in a manner analogous to the first electrode. In this case, the further contact can contact a foil structure of the second electrode.

In various embodiments, a foil structure which has been worked by means of a process as described herein can be used in an energy storage, e.g. a battery, e.g. a rechargeable battery, e.g. a rechargeable lithium ion battery. In various embodiments, the worked foil structure can be used in an electrode (e.g. anode and/or cathode) in the energy storage.

An energy storage can, for example, include or be formed by a specific type of rechargeable lithium ion battery, e.g. rechargeable lithium-polymer battery, a rechargeable lithium-cobalt dioxide battery ($LiCoO_2$), a rechargeable lithium titanate battery, a rechargeable lithium air battery, a rechargeable lithium-manganese dioxide battery, a rechargeable lithium-manganese oxide battery, a rechargeable lithium-iron phosphate battery ($LiFePO_4$), a rechargeable lithium-manganese battery, a rechargeable lithium-iron-yttrium-phosphate battery and/or a rechargeable tin-sulfur lithium ion battery.

Depending on the type of rechargeable battery, the active material can include or be formed by, for example, lithium-iron phosphate (LFPO) (e.g. in a rechargeable lithium-iron phosphate battery), include or be formed by lithium-manganese oxide (LMO) (e.g. in a rechargeable lithium-manganese oxide battery) or include or be formed by lithium titanate (LTO) (e.g. in a rechargeable lithium titanate battery). For rechargeable lithium ion batteries, the active material can also be referred to as lithium compound active material.

Depending on the type of rechargeable battery, the active material (electrode active material) can be used to form an anode (e.g. in the case of LTO) or a cathode (e.g. in the case of LFPO and/or LMO). The anode and/or the cathode of the energy storage can then include or be formed by the foil structure according to various embodiments.

A coating arrangement can, according to various embodiments, include the following: a vacuum chamber which has at least one coating region; at least one material vapor source (i.e. one or more material vapor sources, e.g. as part of a material vapor source arrangement) for producing material vapor in the coating region; a winding-off roller for winding off a foil structure being introduced into the coating region from a roll; a winding-up roller for winding up the foil structure which is brought out of the coating region into a roll; a plurality of transport rollers which define a transport path along which the foil structure is transported through the coating region between the winding-off roller and the winding-up roller; and a drive system which is coupled to at least a major part of the plurality of transport rollers, the winding-off roller and the winding-up roller so as to produce a uniform advance motion of the foil structure; where the major part of the plurality of transport rollers has at least one deflection roller for deflecting the transport path (e.g. by more than about 45°, e.g. by more than about 60°) transverse to an axis of rotation of the deflection roller and the major part of the plurality of transport rollers has at least one lateral stretching roller for tensioning the foil structure along an axis of rotation of the lateral stretching roller.

In various embodiments, a process can include the following: transporting of a foil structure in a coating region in a vacuum chamber, where the foil structure has a metallic surface and the foil structure has a thickness of less than about 40 µm, e.g. less than about 35 µm, e.g. less than about 30 µm, e.g. less than about 25 µm, e.g. less than about 20 µm, e.g. less than about 15 µm, e.g. less than about 10 µm, e.g. less than about 5 µm, e.g. in the range from about 10 µm to about 30 µm.

The process can further include: production of material vapor (also referred to as gaseous coating material) in the coating region; and formation of an electrically conductive protective layer on top of the metallic surface of the foil structure, with the formation of the electrically conductive protective layer occurring from at least the material vapor.

In various embodiments, the foil structure can include a laminate of at least one polymer and at least one metallic material (e.g. metal). As an alternative, the foil structure can be formed by the metallic material. In both cases, the metallic surface of the foil structure can include or be formed by the metallic material.

In various embodiments, the process can further include: production of further material vapor which includes at least one buffer layer material which differs from the metallic surface; and formation of a buffer layer between the metallic surface of the foil structure and the protective layer, with the buffer layer being formed from the further material vapor; as an alternative or in addition, at least partial mixing of the material vapor with the further material vapor can occur so as to form a composition gradient in the protective layer transverse to the metallic surface of the foil structure.

In various embodiments, the process can further include: removal of a surface layer of the foil structure (e.g. before formation of the layer) to at least partly expose the metallic surface of the foil structure.

In various embodiments, the protective layer can have a contiguous microstructure which covers a major part of the metallic surface of the foil structure. As an alternative or in addition, the protective layer can form strong chemical bonds with the metallic surface of the foil structure.

In various embodiments, the protective layer can be formed on both sides of the foil structure. For example, the foil structure can have a metallic surface on both sides (e.g. in the case of a metal foil or a polymer film which has been coated with metal on both sides). In other words, the underside and the upper side of the foil structure can have been or be coated.

In various embodiments, the foil structure (can also be referred to as foil, foil-like support or foil-like substrate) can include a polymer (e.g. an organic polymer or a fiber composite) and a metallic coating (e.g. on one or both sides), with the metallic coating at least partly covering the polymer and forming the metallic surface of the foil structure. As an alternative, the foil structure can have been or be formed by metal which forms the metallic surface of the foil structure.

In various embodiments, the removal can be carried out on both sides so that the foil structure has an exposed metal surface on the upper side and an exposed metal surface on the underside. The distance between the surface on the upper side of the foil structure and the surface on the underside of the foil structure can define the thickness of the foil structure.

In various embodiments, a coating or layer (e.g. the first layer and/or the second layer or the joint layer) can have a thickness (layer thickness) in a range from about 5 nm to about 500 nm, e.g. in the range from about 100 nm to about 200 nm. For example, a layer including carbon can have a thickness in the range from about 5 nm to about 50 nm, e.g. in the range from about 5 nm to about 20 nm. For example, a layer including metal (e.g. in the form of a protective layer or a metal coating of a foil structure) can have a thickness in the range from about 100 nm to about 500 nm, e.g. in the range from about 200 nm to about 500 nm. For example, a layer including metal (e.g. in the form of a buffer layer or gradient layer), e.g. chromium and/or titanium, can have a thickness in the range from about 5 nm to about 50 nm, e.g. in the range from about 10 nm to about 40 nm, e.g. in the range from about 20 nm to about 30 nm.

In various embodiments, the coating, e.g. the first layer and/or the second layer and/or the joint layer, (e.g. in the form of a gradient layer), can include or be formed by an inorganic material (e.g. a metal or carbon). In other words, the first layer and/or the second layer and/or the joint layer can in each case be an inorganic layer.

In the context of the present description, an organic material can be a compound of carbon which is, regardless of the respective state of matter, present in chemically uniform form and is characterized by characteristic physical and chemical properties. Apart from compounds without carbon, some carbon-containing compounds such as carbides (e.g. metal carbide, pure carbon, graphite, nanocrystalline and microcrystalline graphite, diamond or graphene), carbonates and oxides of carbon present in chemically uniform form and characterized by characteristic physical and chemical properties can, regardless of the respective state of matter, be considered to be inorganic materials for the purposes of the present description. In the context of the present description, the term "material" encompasses all abovementioned materials, for example an organic material and/or an inorganic material. Furthermore, a material mixture can in the context of the present description be something which consists of constituents composed of two or more different materials whose constituents are, for example, very finely divided. The term "material" can be used synonymously with the term "substance".

For the purposes of the present description, an organic layer can be considered to be a layer which includes or is formed by an organic material. In an analogous way, an inorganic layer can be considered to be a layer which includes or is formed by an inorganic material. In an analogous way, a metallic layer (also referred to as metal layer) can be considered to be a layer which includes or is formed by a metal. In an analogous way, a carbon layer can be considered to be a layer which includes or is formed by carbon.

A metal layer can, for example, include more than 50 at-% of metal, e.g. more than 70 at-% of metal, or, for example, more than 90 at-% of metal. A carbon layer can, for example, include more than 50 at-% of carbon, e.g. more than 70 at-% of carbon, or, for example, more than 90 at-% of carbon.

In an analogous way, a metallic foil structure (also referred to as metal foil) can be considered to be a foil structure which includes or is formed by a metal. As an alternative, the foil structure can, for example, be a metal-coated polymer film.

For the purposes of the present description, a polymer is an organic material in polymer form (i.e. an organic polymer), e.g. polyamide, polyethylene terephthalate (PET), polytetrafluoroethylene (PTFE), or electrically conductive polymer.

In various embodiments, the specific electrical conductivity of an electrically conductive material, of a metal, of the first layer, of the second layer and/or of the joint layer can be greater than $10^4$ S/m, e.g. greater than $10^5$ S/m.

In various embodiments, the foil structure can include or be formed by a first material (e.g. a first metal) and a coating or layer (e.g. the first layer and/or the second layer or the joint layer), or the material vapor by means of which the coating or layer is formed can include or be formed by a second material (e.g. a second metal, a carbon or free of metal), where the first material and the second material are different.

In various embodiments, an energy storage (e.g. a rechargeable battery or a battery) can include the following: a first electrode which has a first chemical potential and further includes: a foil structure which has a thickness of less than 40 µm; an active material which is arranged on the foil structure, with the active material providing the first chemical potential of the first electrode; a layer which is arranged between the foil structure and the active material, where the layer has a contiguous microstructure which covers at least a major part of the foil structure and/or the layer has a microstructure having strong chemical bonds to the foil structure; a second electrode which has a second chemical potential; and an encapsulation which surrounds the first electrode and the second electrode.

In various embodiments, a structure can include the following: a foil structure which has a thickness of less than 40 µm; a (for example electrically conductive) layer which is arranged on or above the foil structure, where the layer has a contiguous microstructure which covers at least a major part of the foil structure and/or the layer has a microstructure having strong chemical bonds to the foil structure.

In various embodiments, it is possible for, instead of the foil structure, a support structure (illustratively a thicker substrate than the foil structure) to have been or be coated, e.g. a support structure which includes the foil structure. The support structure can have a thickness of less than about 250 µm (e.g. less than about 200 µm, e.g. less than about 150 µm, e.g. less than about 100 µm) and/or of more than about 40 µm, e.g. in the range from about 100 µm to about 250 µm.

In various embodiments, an energy storage can include the following: a first electrode which has a first chemical potential and further includes: a support structure which has a thickness of less than 250 µm; an active material which is arranged on the support structure, with the active material providing the first chemical potential of the first electrode; a protective layer which is arranged between the support structure and the active material, where the layer has a contiguous carbon microstructure which covers at least a major part of the support structure and/or the layer has a microstructure having strong chemical bonds to the support structure; a second electrode which has a second chemical potential; and an encapsulation which surrounds the first electrode and the second electrode.

In various embodiments, the support structure can include or be formed by a foil structure which has a thickness of less than 40 µm.

In various embodiments, the support structure (e.g. the foil structure) can include a laminate of various materials, e.g. a plurality of foils or supports which differ in terms of their chemical composition. As an alternative, the support structure (e.g. the foil structure) can include or be formed by a homogeneous chemical composition (i.e. precisely one material). For example, the support structure can include or be formed by a semiconductor material (e.g. silicon and/or in the form of a wafer, e.g. a silicon wafer), a metal (e.g. an alloy) and/or a dielectric (e.g. glass and/or mica).

Mica can be considered to be a sheet silicate or a group of sheet silicates, e.g. having the chemical composition: D $G_{2.3}[T_4O_{10}]X_2$. "D" can be a 12-fold coordinated cation (e.g. potassium, sodium, calcium, barium, rubidium, cesium and/or an ammonium ion ($NH_4^+$)). "G" can be a 6-fold coordinated cation (e.g. lithium, magnesium, iron 2+ ($Fe^{2+}$), magnesium, zinc, aluminum, iron 3+($Fe^{3+}$), chromium, vanadium and/or titanium). "T" can be a 4-fold coordinated cation (e.g. silicon, aluminum, iron 3+, boron and/or beryllium). "X" can be an anion (for example a hydroxide ion ($OH^-$), a fluoride ion ($F^-$), chloride ion ($Cl^-$), oxygen ion ($O^{2-}$) and/or a sulfur ion ($S^{2-}$)).

In various embodiments, the foil structure can include or be formed by a semiconductor material (e.g. silicon), a metal (e.g. an alloy) and/or a dielectric (e.g. glass), e.g. flexible glass, thin glass, a flexible wafer.

For example, the support structure (e.g. the foil structure) can include or be formed by a support coated with metal (e.g. on one or both sides). As an alternative, the support structure (e.g. the foil structure) can be formed by the metal. In other words, the support structure (e.g. the foil structure) can, for example, include or be formed by a metal support.

As an alternative, the support structure can be formed by the polymer. In other words, the support structure can be, for example, a polymer support.

In the case of thin film batteries (TFB) the second layer (e.g. in the form of a functional layer) can, for example, be used as current collector and/or power outlet lead, e.g. when this has no or very little bonding agent function. For example, the second layer can include or be formed by Pt or another noble metal (e.g. gold, silver, iridium). Although the use of a noble metal can incur higher costs, the noble metal can oxidize to a lesser extent or not at all, e.g. during subsequent coating steps or heating processes.

As an alternative, the second layer can include or be formed by a cheaper material, e.g. Al and/or Cu. This can then be at least partially chemically reacted with a first layer (e.g. a carbon layer) arranged thereon, for example by means of heating of the second layer, e.g. to form a carbide, e.g. to form a metal carbide. Heating can be effected by means of a furnace or by means of pulsed irradiation. Heating can include bringing to a temperature of the first layer and/or the second layer of more than about 600° C.

As an alternative or in addition, the second layer can include or be formed by a previously produced carbide (e.g. metal carbide) and/or nitride (e.g. metal nitride).

In various embodiments, the first layer (e.g. the protective layer) can have a lower chemical activity than the support structure (e.g. the foil structure), than the second layer and/or than the active material. As an alternative or in addition, the second layer (e.g. the buffer layer) can have a lower chemical activity than the support structure (e.g. the foil structure) and/or than the active material.

In various embodiments, the first layer (e.g. the protective layer) can have a porosity lower than or equal to that of the support structure (e.g. that of the foil structure) and/or that of the active material. As an alternative or in addition, the second layer (e.g. the buffer layer) can have a porosity lower than or equal to that of the support structure (e.g. the foil structure) and/or that of the active material. A lower chemical activity can be achieved in this way.

In various embodiments, the first layer (e.g. the protective layer) can have a surface roughness lower than or equal to that of the support structure (e.g. the foil structure) and/or that of the active material. As an alternative or in addition, the second layer (e.g. the buffer layer) can have a surface roughness lower than or equal to that of the support structure (e.g. the foil structure) and/or that of the active material. A lower chemical activity can be achieved in this way.

In various embodiments, the second layer (e.g. the buffer layer) can include or be formed by a metal, carbon, a metal nitride (e.g. aluminum nitride, copper nitride, titanium nitride, and/or chromium nitride) and/or a metal carbide (e.g. aluminum carbide, copper carbide, titanium carbide, and/or chromium carbide).

In various embodiments, the first layer (e.g. the protective layer) can include or be formed by a contiguous carbon microstructure.

In various embodiments, a contiguous microstructure can include or be formed by a macroscopically contiguous microstructure, i.e. the microstructure can be contiguous, e.g. free of interruptions or openings (such as pores), on a length scale of more than about 1 mm (e.g. more than about 1 cm) or an area scale of more than about 1 mm$^2$ (e.g. more than about 1 cm$^2$).

In various embodiments, the second layer can be arranged between the first layer and the foil structure; and/or the second layer can include or be formed by a metal carbide, a metal nitride and/or a metal.

Working examples of the disclosure are shown in the figures and will be explained in more detail below.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiment. In the following description, various embodiments are described with reference to the following drawings, in which.

DETAILED DESCRIPTION

Figure 1A:
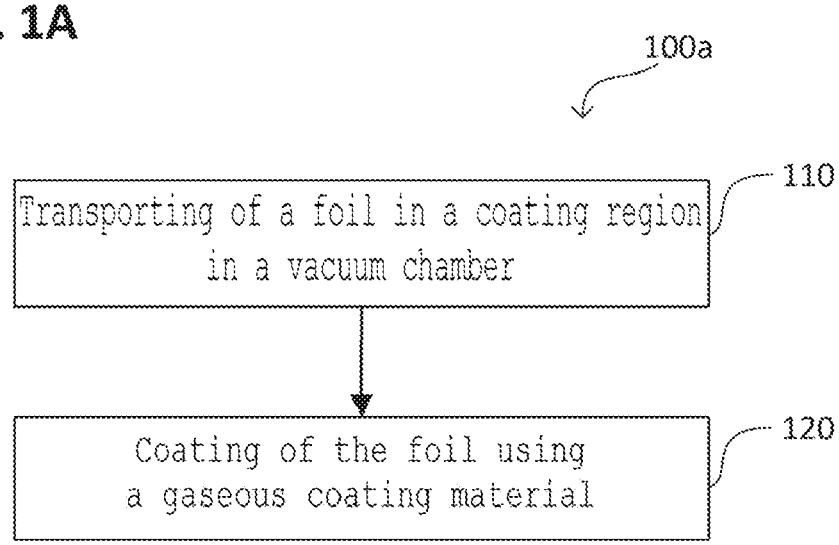
FIG. 1A and FIG. 1B in each case a process according to various embodiments in a schematic flow diagram.

In the following comprehensive description, reference will be made to the accompanying drawings which form part of this description and in which specific embodiments of how the disclosure can be performed are shown for the purposes of illustration. In this respect, directional terminology such as "at top", "at bottom", "at front", "at rear", "front", "rear", etc. is used with reference to the orientation of the figure(s) described. Since components of embodiments can be positioned in a number of different orientations, the directional terminology serves for the purposes of illustration and does not restrict the disclosure in any way. It goes without saying that other embodiments can be utilized and structural or logical changes can be made without going outside the scope of protection of the present disclosure. It goes without saying that the features of the various illustrative embodiments described herein can be combined with one another, unless specifically indicated otherwise. The following comprehensive description is therefore not to be interpreted in a restrictive sense, and the scope of protection of the present disclosure is defined by the accompanying claims.

In the context of the present description, the terms "joined", "connected" and "coupled" are used to describe both a direct and indirect join, a direct or indirect connection and a direct or indirect coupling. In the figures, identical or similar elements are denoted by identical reference numerals, in so far as this is appropriate.

In various embodiments, a PVD-based deposition (E-beam and/or sputtering) of amorphous carbon layers (DLC) with or without metal buffer layer on thin Al or Cu foil (e.g. having a thickness of about 20 μm) and/or on Al- or Cu-coated polymer film is provided in order to improve the corrosion properties with illustratively good electrical conductivity. A foil processed by a process according to various embodiments can, for example, be used in lithium ion batteries (LIB).

In various embodiments, an amorphous carbon layer having an $sp^3$ bonding proportion of less than about 40 at-% and optionally at least one metal buffer for reducing the intrinsic stresses of the amorphous carbon layer is applied by means of cathode atomization (also referred to as sputtering technology) and/or electron beam vaporization (electron beam evaporation). Furthermore, a plasma pretreatment for removing a surface layer, e.g. the natural passivating layer (e.g. oxide layer) or for chemically activating the surface can optionally be carried out.

Chemical activation can mean that the chemical reactivity of the surface of the foil structure is increased by removal of a surface layer.

In various embodiments, a process can include the following: coating of a foil structure (e.g. including deposition of at least one carbon contact layer which has a thickness in the range from about 10 nm to about 300 nm), e.g. using electron beam PVD (EB-PVD) and/or sputtering.

Coating can optionally include one or more of the following: formation of a plasma from a gas (plasma enhancement), formation of an ion beam (ion bombardment of the foil structure), formation of a plasma from material vapor (plasma activation of the vapor) and/or heating of the foil structure (substrate heating).

The process can optionally further include one or more of the following:
Formation of at least one additional metal layer (including Ti, Cr, Al, Cu, Ni, Hf, Zr, Ta, V, Fe, Mo and/or W), i.e. one or more additional metal layers, e.g. in the form of a buffer layer,
which has a thickness in the range from about 10 nm to about 300 nm,
where the formation of the at least one additional metal layer is carried out using (e.g. by means of) EB-PVD and/or sputtering, and
the formation of the at least one additional metal layer is optionally carried out using plasma enhancement, ion bombardment of the foil structure, plasma activation of the vapor or substrate heating;
Formation of at least one metal-carbon gradient layer, e.g. in the form of a buffer layer and/or in the form of a protective layer;
which has a thickness in the range from about 10 nm to about 600 nm,
where the metal sublayer thereof (including Ti, Cr, Al, Cu, Ni, Hf, Zr, Ta, V, Fe, Mo and/or W) and the carbon sublayer each have a thickness in the range from about 10 nm to about 300 nm,
where the formation of the metal-carbon gradient layer is carried out using (e.g. by means of) EB-PVD and/or sputtering,
and the formation of the metal-carbon gradient layer is optionally carried out using plasma enhancement, ion bombardment of the foil structure, plasma activation of the vapor and/or substrate heating.

FIG. 1A shows a process 100a according to various embodiments in a schematic flow diagram.

The process 100a can, in 110, include: transporting of a foil structure in a coating region in a vacuum chamber, where the foil structure has a thickness of less than 40 µm; and can, in 120, include: coating of the foil structure using a gaseous coating material.

In various embodiments, the process 100a optionally includes one of the following:

coating of the foil structure, e.g. formation (e.g. deposition) of at least one layer (i.e. one, more than one or all layers) using EB-PVD;

coating of the foil structure, e.g. formation (e.g. deposition) of at least one layer (i.e. one, more than one or all layers) using sputtering;

coating of the foil structure, e.g. formation (e.g. deposition) of at least one layer (i.e. one, more than one or all layers) using sputtering and using substrate heating;

coating of the foil structure, e.g. formation (e.g. deposition) of at least one layer (i.e. one, more than one or all layers) using EB-PVD and using (i.e. in combination with) plasma activation of the vapor, ion bombardment or substrate heating;

coating of the foil structure, e.g. formation (e.g. deposition) of at least one layer (i.e. one, more than one or all layers) using EB-PVD and using ion bombardment and using substrate heating;

formation of a gradient (composition gradient) between at least two layers by (a) mixing of material vapor during coating (static or dynamic codeposition, e.g. by means of ion mixing) and/or (b) diffusion using heat input into the foil structure, i.e. by means of heating the foil structure or of the at least two layers, e.g. during or after formation of the second layer (i.e. during or after the second coating step);

coating of the foil structure, e.g. formation of at least one layer (e.g. the first layer, the second layer and/or the joint layer) using at least one metal from the following group: Ti, Cr, Al, Cu, Ni, Hf, Zr, Ta, V, Fe, Mo, W; and/or using an alloy which includes at least one metal from the group, e.g. as substantial constituent (i.e. based thereon);

coating of the foil structure, e.g. formation of at least one layer (e.g. the first layer, the second layer and/or the joint layer) using at least one electrically conductive metal nitride (a compound of a metal and nitrogen (N)) from the following group: TiN, $TiN_x$, CrN, $Cr_2N$, $CrN_x$, NbN, $NbN_x$, NbCrN, $NbCr_xN_y$;

coating of the foil structure, e.g. formation of at least one layer (e.g. the first layer, the second layer and/or the joint layer) using at least one electrically conductive metal carbide (a compound of a metal and carbon (C)) from the following group: TiC, $TiC_x$, $CrC_x$;

coating of the foil structure using substrate heating before and/or during coating. The foil structure can be heated, i.e. the foil temperature can be set, by means of the substrate heating;

coating of the foil structure using heat radiation for substrate heating. The foil structure can be heated, i.e. the foil temperature can be set, by means of the substrate heating;

coating of the foil structure using electron bombardment (i.e. use of, for example, an electron beam) for substrate heating. The foil structure can be heated, i.e. the foil temperature can be set, by means of the substrate heating;

coating of the foil structure using ion bombardment (i.e. using, for example, an ion beam) for substrate heating. The foil structure can be heated, i.e. the foil temperature can be set, by means of the substrate heating;

coating of the foil structure using a foil temperature (can also be referred to as substrate temperature), i.e. a temperature of the foil structure, in the range from about 100° C. to about 500° C.;

coating of the foil structure using a foil temperature in the range from about 150° C. to about 450° C.;

coating of the foil structure using a foil temperature in the range from about 200° C. to about 300° C.

Figure 1B:
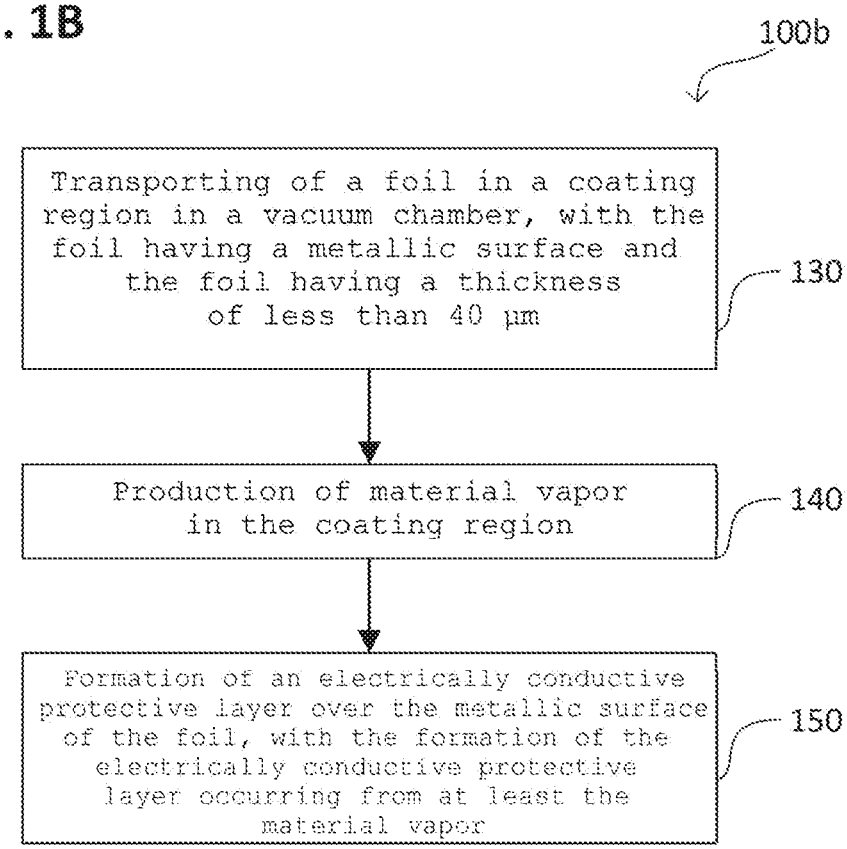

FIG. 1B shows a process 100b according to various embodiments in a schematic flow diagram.

In various embodiments, the process 100b can, in 130, include: transporting of a foil structure into a coating region in a vacuum chamber, where the foil structure has a metallic surface and the foil structure has a thickness of less than 40 µm. Furthermore, the process 100b can, in 140, include: production of material vapor (also referred to as gaseous coating material) in the coating region. Furthermore, the process 100b can, in 150, include: formation of an electrically conductive protective layer (also referred to as contact layer) on top of the metallic surface of the foil structure, where the formation of the electrically conductive protective layer occurs from at least the material vapor.

In various embodiments, the process 100b optionally includes one of the options described above for the process 100a.

Figure 2A:
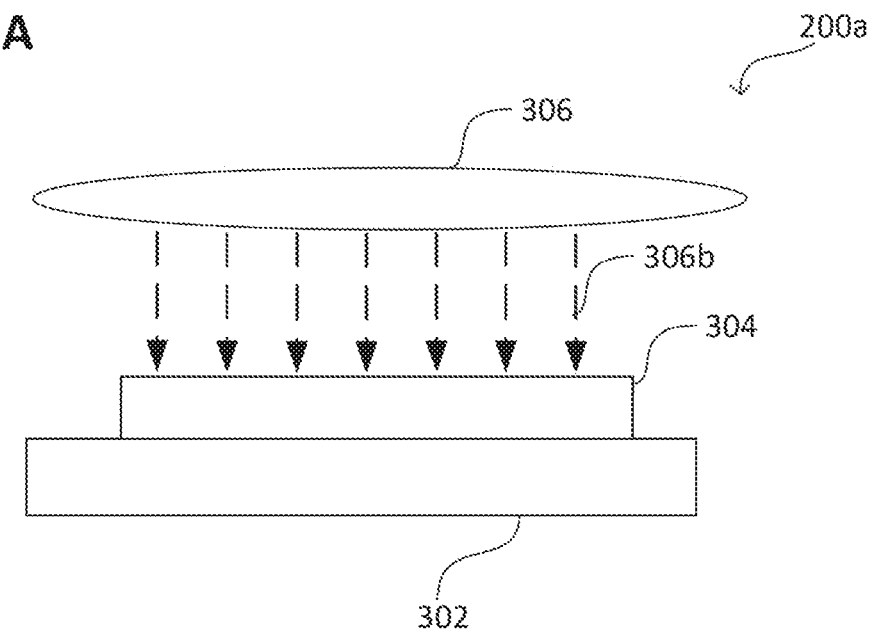
FIG. 2A and FIG. 2B in each case a process according to various embodiments in a schematic side view or a schematic cross-sectional view.

FIG. 2A shows a foil structure 302 in a process 200a according to various embodiments in a schematic side view or a schematic cross-sectional view.

The coating of the foil structure 302 can include the formation of a layer 304 (e.g. in the form of a protective layer). The formation of the layer 304 can be carried out by means of deposition of a material 306b (i.e. a gaseous coating material) using at least one material vapor source 306, or a material vapor source arrangement having one or more material vapor sources 306. The at least one material vapor source 306 can have one material vapor source or a plurality of material vapor sources. Furthermore, the formation of the layer 304 can be carried out in a vacuum or subatmospheric pressure with a regulated gas composition or regulated composition of the atmosphere, i.e. in a process atmosphere.

For example, the process atmosphere in which the layer 304 is formed (e.g. deposited) can include an inert (relatively unreactive) gas and/or a reducing gas for taking up oxygen (and thus for protecting the layer 304 against oxidation), e.g. hydrogen, nitrogen, $N_2/H_2$ mixture or hydrazine. For example, the formation of the layer 304 can be effected by means of cathode atomization and/or electron beam vaporization.

Furthermore, the formation of the layer 304 can occur spatially uniformly (e.g. homogeneously) on the surface of the foil structure 302. The layer 304 can illustratively be deposited at a spatially uniform coating rate or with a spatially uniform material composition. As an alternative, the formation of the layer 304 can, according to various embodiments, occur inhomogeneously (nonuniformly). For example, only particular regions of the foil structure 302 can be coated, or the layer 304 can be deposited with a spatially nonuniform chemical composition, e.g. using a mask (also referred to as shadow mask or template).

In various embodiments, the proportion of carbon in the deposited layer 304 can have been or be set according to a prescribed composition. For example, the layer 304 can be formed by material being transferred (transported) from a target (known as the target material) of the material vapor source (where the target can have a composition as per the prescribed composition) to the foil structure 302. If a plurality of targets are used, each target material of the plurality of targets can have a composition corresponding to the prescribed composition.

For example, a target material (the material to be atomized, to be sublimed or vaporized) can be converted (i.e. atomized, sublimed or vaporized) into a gaseous state (i.e. into the gaseous coating material) using cathode atomization 306b or using electron beam vaporization 306b.

For example, a material vapor source 306 can be a carbon material vapor source having a proportion of carbon (or the target material thereof) of more than 50 at-%, with the deposited layer 304 likewise being able to have a proportion of carbon of more than 50 at-%. For example, the material vapor source 306 can have a proportion of carbon of more than 70 at-% (or, for example, 90 at-%), with the deposited layer 304 being able to have a proportion of carbon of more than 70 at-% (or, for example, 90 at-%).

Furthermore, in the formation of the layer 304, constituents of the process atmosphere can be at least partially incorporated into the layer 304. For example, hydrogen and/or nitrogen from the process atmosphere can be incorporated into the layer 304, so that the layer 304 can consist partially (e.g. in a range from about 1 at-% to about 20 at-%) of hydrogen and/or nitrogen. For example, a carbon-hydrogen mixture, which can also be referred to as hydrogenated carbon, can be deposited using a hydrogen process atmosphere. For example, a metal/nitrogen mixture, which can also be referred to as metal nitride, can be deposited using a nitrogen process atmosphere.

The incorporation of hydrogen into the layer 304, i.e. the degree, the amount or the speed to which/at which the hydrogen is taken up by the layer 304, can depend on the foil temperature. For example, lesser amounts of hydrogen can be incorporated into the layer 304, the hotter the foil temperature.

For example, a layer system having a layer composed of metal and a layer composed of carbon with, for example, a hydrogen concentration of about $9*10^{15}$ at/cm$^2$, i.e. less than 1 at-% of hydrogen, can give better ICR values than a comparable layer system having a hydrogen concentration of about $30*10^{15}$ at/cm$^2$ (i.e. 2 at-%).

Furthermore, the layer 304 (e.g. a carbon layer) can, for example, have a plurality of regions each having a different carbon configuration (bonding structure of the carbon or composition of sp$^2$- and sp$^3$-hybridized carbon). For example, regions of the layer 304 can have a carbon microstructure in the form of graphite (with a proportion of sp$^2$-hybridized carbon of more than 90 at-%), nanocrystalline graphite (having a particle size of the graphite in the range from about 1 nm to about 100 nm, e.g. having an average particle size in the range from about 1 nm to about 100 nm, e.g. in the range from about 10 nm to about 50 nm), amorphous carbon (with a proportion of sp$^2$-hybridized carbon in the range from about 60 at-% to about 90 at-%) or tetrahedral carbon (with a proportion of sp$^3$-hybridized carbon of more than 40 at-%).

The layer 304 (e.g. a carbon layer) can increase the mechanical strength of the foil structure 302, for example in the case of an Al foil, Cu foil or polymer film (e.g. Al-coated and/or Cu-coated).

As an alternative, the formation of the layer 304 can include depositing a metal, e.g. NiCr or Ti, on the foil structure 302. In other words, the layer 304 can then include the metal. A corrosion-resistant metal layer (e.g. in the form of a protective layer) can thus illustratively have been or be formed. For this purpose, a target having an appropriate composition, as has been described above for carbon, can be used. A coating including titanium, NiCr or an NiCr alloy can, for example, have and/or provide a high mechanical strength and chemical resistance.

To effect coating, the foil structure 302 can be transported through a coating region (not shown, cf. FIG. 5A) in which the production and deposition of the gaseous coating material 306b can occur by means of a material vapor source 306 (as part of the material vapor source arrangement). For example, the foil structure 302 can be transported at constant or variable (e.g. changeable over time) speed through the coating region by means of a transport arrangement (e.g. including rollers). In addition, the foil structure 302 can be transported into the coating region and transported out from the coating region again after coating by means of a transport arrangement.

Figure 2B:
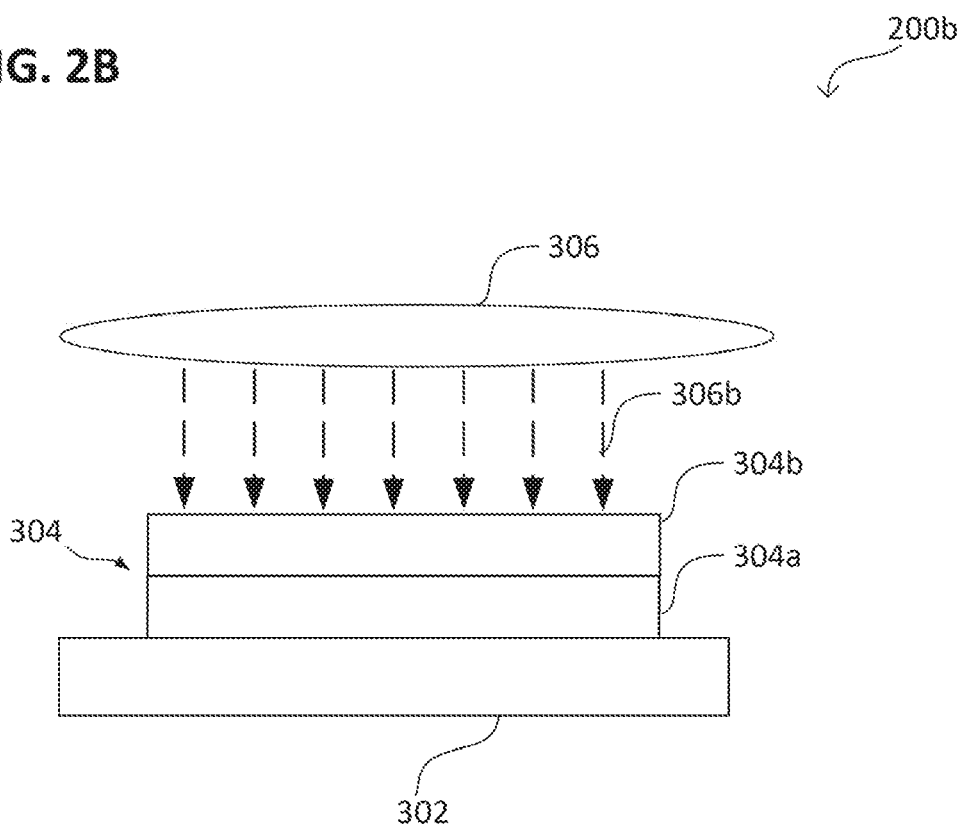

FIG. 2B shows a foil structure 302 in process 200b according to various embodiments in a schematic side view or a schematic cross-sectional view.

In various embodiments, the layer 304 (e.g. in the form of a protective layer) can, for example, have been or be formed in two layers or with more than two layers (e.g. in three or four layers, etc.) by means of a material vapor source arrangement (having, for example, one material vapor source 306 or a plurality of material vapor sources 306). For example, a first sublayer 304a (first layer) can be deposited and a second sublayer 304b (second layer) can be deposited thereon. The composition of the respective sublayers of the layer 304 can be set in accordance with a prescribed composition by means of the process parameters, e.g. by means of the composition of the target material of the material vapor source or each of the plurality of material vapor sources.

For example, the first sublayer 304a can include a metal (e.g. Ti, Cr, Al, Cu, Ni, Hf, Zr, Ta, V, Fe, Mo and/or W), e.g. an alloy, a metal alloy. The first sublayer 304a can have been or be formed using a material vapor source 306 or a material vapor source arrangement 306 having a plurality of material vapor sources. For example, the material vapor source arrangement 306 can have one metal material vapor source (which can consist to an extent of more than 50 at-% of the respective metal). In this case, the first sublayer 304a can be a metal layer (which can consist to an extent of more than 50 at-% of metal). The first sublayer 304a can illustratively be a metal buffer layer for increasing the adhesion capability of the layer 304, as has been described above. The first sublayer 304a can optionally include carbon or have at least one gradient of the carbon content, so that the proportion of carbon increases (or decreases), with increasing layer thickness, during deposition 306b of the layer 304.

The adhesion capability of the layer 304 to the foil structure 302 can be considered to be the ability of the layer 304 to follow an elongation or deformation of the foil structure 302 (e.g. as a result of thermal expansion or forming) without becoming detached from the foil structure 302. The adhesion capability can illustratively be determined by means of a scratch and adhesive bonding test. Here, the layer is scratched and an attempt is subsequently made to detach an adhesive tape from the foil structure 302.

If virtually no layer material is removed on pulling off the adhesive tape, it can be assumed that the layer has sufficient mechanical strength.

The metal of the first sublayer 304a and the carbon of the first sublayer 304a can optionally form a chemical bond, i.e. form an electrically conductive metal carbide. In this case, the first sublayer 304a can include or be formed by an electrically conductive metal carbide.

A nonmetallic element can optionally be incorporated into the first sublayer 304a, e.g. by incorporating a constituent of the process atmosphere into the first sublayer 304a. For example, nitrogen can be incorporated into the first sublayer 304a. In this case, the first sublayer 304a can include or be formed by an electrically conductive metal nitride.

The second sublayer 304b can, for example, be deposited by means of a material vapor source arrangement 306, where the material vapor source arrangement 306 can include a carbon material vapor source (which can consist to an extent of more than 50 at-% of carbon), and can be a carbon layer (which can consist to an extent of more than 50 at-% of carbon) and additionally have a gradient of the proportion of carbon, as has been described for FIG. 2A.

The deposition of the first sublayer 304a and of the second sublayer 304a can, for example, be carried out in succession by means of a plurality of material vapor sources having different compositions (e.g. at least one metal material vapor source and at least one carbon material vapor source). Furthermore, the coating region (the region of the foil structure 302 on which the material of the layer 304 is deposited for layer formation) of at least two of the plurality of material vapor sources can overlap, so that partial mixing of the material vapors produced and thus of the deposited materials occurs between the at least two of the plurality of material vapor sources.

For example, a gradient in a composition of the layer 304 (e.g. a gradient of the proportion of carbon) between the at least two of the plurality of material vapor sources can be produced by means of the at least two of the plurality of material vapor sources. For example, a carbon/metal mixture can illustratively be deposited in a region between the first and the second material vapor source (in the overlap region).

As an alternative, an NiCr mixture (e.g. using an Ni target and a Cr target) having a prescribed composition of the layer 304 (i.e. stoichiometrically) and/or having a composition gradient of the layer 304 can, for example, be deposited. For example, a stoichiometric target (i.e. a target having the prescribed composition) can be used, and this is converted into material vapor using sputtering or using electron beam vaporization. As an alternative, cocoating can be carried out, i.e. using more than one material vapor source, with a first material vapor source including an Ni target (Ni target material) and a second material vapor source including a Cr target (Cr target material).

To deposit the metal, e.g. NiCr, it is possible to use, for example, a foil temperature in the range from about 200° C. to about 300° C.

Figure 3A:
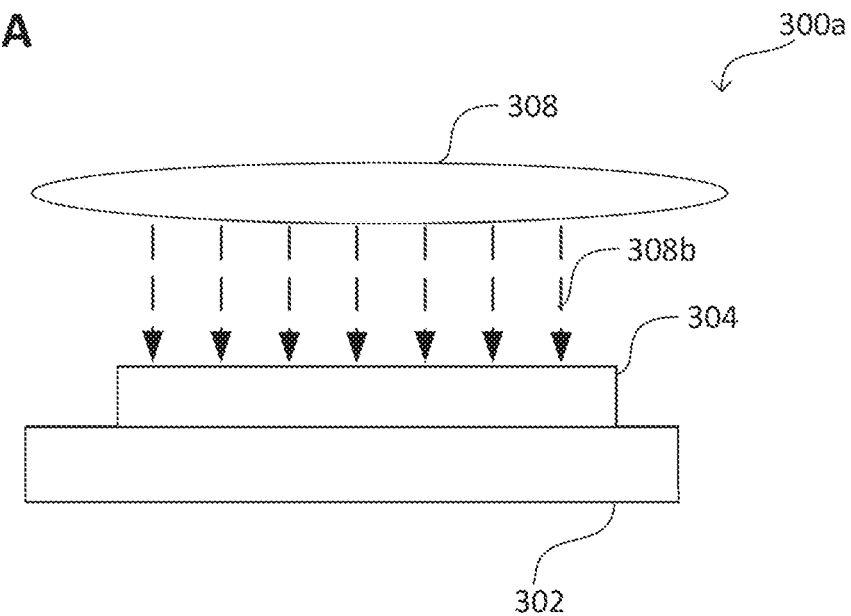
FIG. 3A and FIG. 3B in each case a process according to various embodiments in a schematic side view or a schematic cross-sectional view.

FIG. 3A shows a foil structure 302 in a process 300a according to various embodiments in a schematic side view or a schematic cross-sectional view.

In various embodiments, the process 300a can include the generation of energy pulses, e.g. using at least one irradiation arrangement 308 (also referred to as irradiation apparatus). Irradiation of the layer 304 can be effected by means of the energy pulses.

For example, the at least one irradiation arrangement 308 can include at least one irradiation source, for example a light source (e.g. a laser, a lamp, a flashgun or an X-ray source) or a source of matter (e.g. an electron source or a proton source). Here, the at least one irradiation arrangement 308 can have an irradiation source operated in a pulsed manner or continuously, with pulsed or continuous radiation 308b (e.g. electromagnetic radiation such as light and/or particle radiation such as electron radiation and/or ion radiation) being produced by means of the at least one irradiation arrangement 308, for example a continuous electron beam 308b by means of an electron beam gun (e.g. by means of a linear source) or a pulsed flash of light 308b by means of a flashgun (e.g. a gas discharge lamp or a light-emitting diode).

The irradiation 308b of the layer 304 can be carried out in a manner analogous to the formation of the layer 304 in a process atmosphere (e.g. an inert process atmosphere or a reducing process atmosphere), as is described above for FIG. 2A.

To effect the irradiation 308b, the foil structure 302 can be transported through an irradiation region in which the irradiation 308b of the material can be effected by means of an irradiation source. For example, the foil structure 302 or the layer 304 can be transported at constant or variable (e.g. changeable over time) speed through the irradiation region by means of a transport arrangement.

Furthermore, the radiation 308b generated or the energy impulses 308b generated (radiation 308b) can be directed, deflected or focused by means of an optical apparatus (e.g. by means of mirrors, reflectors, deflectors, orifice plates or by means of lenses). The layer 304 can here be irradiated uniformly (homogeneously) (e.g. using a uniform power density) or be irradiated nonuniformly, e.g. selected regions of the layer 304 can be irradiated, e.g. using a mask.

During the irradiation 308b, a first part of the radiation 308b which has been produced by the irradiation apparatus 308 (having, for example, at least one irradiation source) and directed on to the layer 304 can be absorbed by the layer 304 and converted into heat energy. The first part of the radiation 308b (absorbed by the layer 304) can be greater as the layer thickness increases. Furthermore, a second part of the radiation 308b which is not absorbed by the layer 304 can pass through the layer 304 and impinge on the surface of the foil structure 302, e.g. a metal foil 302 or a metal-coated foil structure 302, with the second part of the radiation 308b being able to be partially absorbed or partially reflected by the foil structure 302. The partially reflected second part of the radiation 308b can be passed back to the layer 304 and likewise be partially absorbed by the layer 304.

In various embodiments, the properties (e.g. the wavelength or the kinetic energy) of the radiation 308b can be adapted to the chemical composition and the properties (e.g. the layer thickness or the absorption properties) of the layer 304 in such a way that the layer 304 can be heated by means of the irradiation and the layer 304 can be at least partially altered structurally. For example, the radiation 308b can be monochromatic or the spectral distribution can be set according to a prescription (e.g. within a particular frequency range or wavelength range) by means of a suitable irradiation source. Furthermore, the radiation 308b can be passed through an absorbing material, with part of the radiation 308b (e.g. part of the frequency range) emitted by the irradiation source being able to be at least partially absorbed (filtered out) by the absorbing material before the layer 304 is irradiated.

Here, the spectral distribution (also referred to as spectral composition) of the radiation 308b (e.g. of photons) can, for example, be set in such a way that the radiation 308b can be predominantly absorbed by the second sublayer 304b (e.g.

the carbon layer) and can mostly (e.g. more than 50%) be reflected by the foil structure 302, e.g. a metal foil 302, or the first sublayer 304a (e.g. the metal buffer layer). Furthermore, the radiation 308b generated can have a wavelength in the range from about 10 nm to about 10 mm, e.g. in the range from about 100 nm to about 1 mm.

The period of time within which the layer 304 can be heated (e.g. to a prescribed temperature) is dependent on the power of the emitted radiation 308b for irradiation of the layer 304 and the penetration depth of the radiation 308b into the layer 304. If the penetration depth is of about the order of magnitude of the layer thickness, the layer 304 can be heated, for example by means of pulsed irradiation, to or by more than 400° C., e.g. more than 1000° C., compared to the foil structure 302, e.g. a metal foil 302, within the pulse duration of the pulsed irradiation.

For example, the layer 304 can have attained a maximum temperature at the end of the radiation pulse or at the end of an illumination time, with the duration of a radiation pulse being able to be matched to the temperature to be attained.

The layer 304 can illustratively be strongly heated briefly by means of irradiation of the layer 304, with the average temperature of the foil structure 302 being able to remain below a maximum value, e.g. below 100° C. or, for example, below 200° C. or, for example, below 400° C.

Furthermore, the time intervals of the irradiation, e.g. the time intervals between irradiation pulses 308b or energy impulses 308b, can be set in such a way that the foil structure 302 can release the heat energy introduced during irradiation to the surroundings (e.g. to the surrounding process atmosphere or to the transport arrangement). In this way, renewed or repeated irradiation can be carried out with an average temperature of the foil structure 302 being able to remain below a maximum value.

Furthermore, the composition of the layer 304 can have an influence on the structural alteration of the layer 304 during irradiation, e.g. on the speed at which the proportion of $sp^2$- and/or $sp^3$-hybridized carbon in the layer 304 is changed (conversion rate). For example, the incorporation of hydrogen, nitrogen or other constituents of the respective process atmosphere during deposition 306b into the layer 304 can increase or reduce the conversion rate, or the proportion of a metal in the layer 304 (e.g. by means of deposition of a carbon/metal mixture) can influence the conversion rate.

Figure 3B:
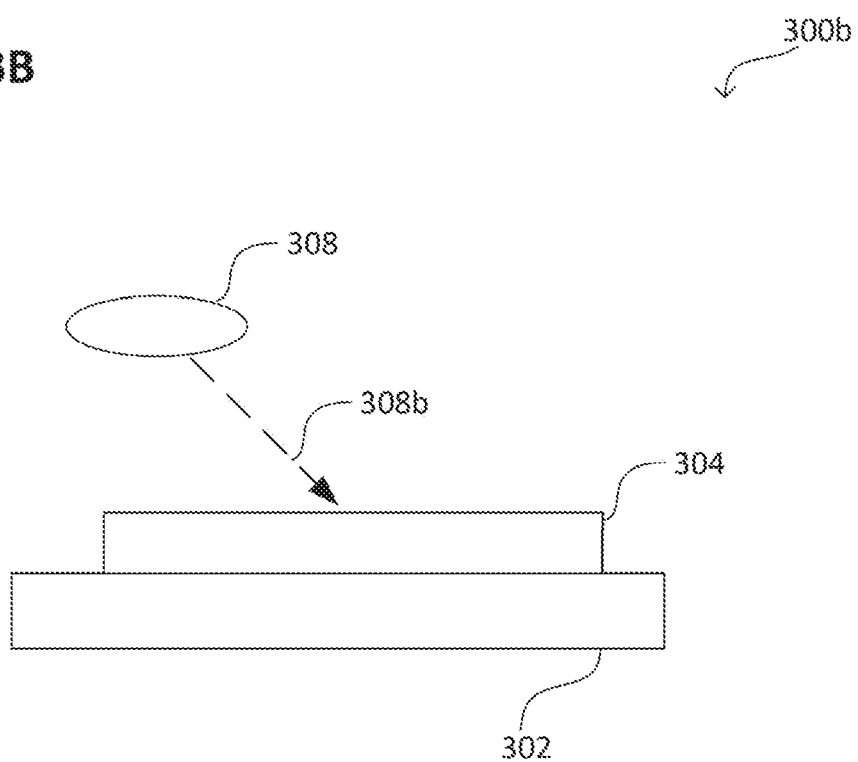

FIG. 3B shows a process 300b according to various embodiments in a schematic side view or a schematic cross-sectional view.

In various embodiments, a region of the layer 304 can be irradiated. Irradiation of a region of the layer 304 can, for example, be advantageous in order to be able to avoid heating of the foil structure 302 above a maximum value, as a result of the heat energy introduced at a constant power density (power per unit irradiated area) being able to be limited.

Furthermore, for example, the irradiation angle (the angle at which the radiation 308b generated by the at least one irradiation arrangement 308 impinges on the foil structure 302) can be set or adjusted. For example, the proportion of the radiation 308b absorbed in the layer 304 can be increased by the radiation 308b impinging at an inclination or obliquely on the layer 304, with the distance which the radiation can cover within the layer 304 being able to be increased by setting of the irradiation angle.

In various embodiments, the radiation 308b produced by the irradiation source can irradiate a plurality of regions of the layer 304 in succession, e.g. the continuous or pulsed radiation 308b can be directed over the surface of the layer 304, or the radiation 308b produced by the plurality of irradiation sources can simultaneously irradiate a number of regions of the layer 304.

Furthermore, the structure of the layer 304 and thus the absorption properties of the layer 304 can be altered by irradiation of the layer 304. For example, the average penetration depth of the radiation 308b can increase (or decrease) as a result of the irradiation of the layer 304, so that the temperature of the layer 304 which is attained during irradiation can decrease (or increase) due to the structural alteration of the layer 304.

Figure 4A:
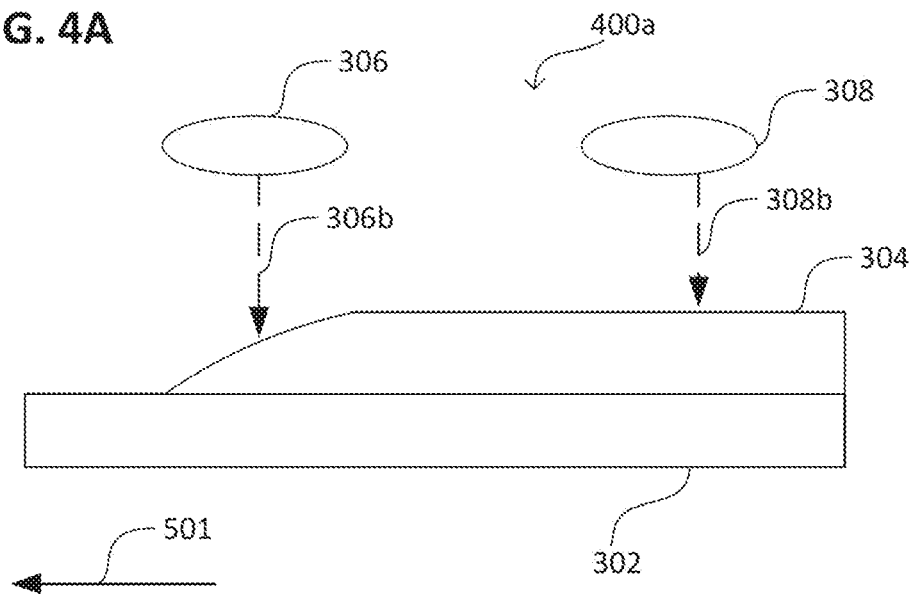
FIG. 4A and FIG. 4B in each case a process according to various embodiments in a schematic side view or a schematic cross-sectional view.

FIG. 4A shows a foil structure 302 in a process according to various embodiments in a schematic side view or a schematic cross-sectional view.

In various embodiments, the foil structure 302 can be transported through a coating region e.g. along a direction 501, so that a layer 304 can be deposited continuously.

After coating 306b by means of a material vapor source arrangement 306 (having, for example, one or more material vapor sources) in a coating region, the foil structure 302 can optionally be transported, e.g. along a direction 501, through an irradiation region in which the layer can be irradiated by means of an irradiation apparatus 308 (having, for example, one or more irradiation sources).

In various embodiments, the surface of the foil structure 302 which is coated and irradiated according to various embodiments can be at least partly (i.e. partially or completely) a metal surface.

For example, the foil structure 302 can be a strip foil 302 or a foil structure 302 which can be transported through a material vapor source arrangement, e.g. through a vacuum chamber or a vacuum chamber arrangement, e.g. from roll to roll, for treatment (coating and irradiation) of the foil structure 302.

The foil structure 302 can, for example, have a width, i.e. an extension in the direction of its lateral extension (e.g. perpendicular to the transport direction) in the range from about 0.01 m to about 7 m, e.g. in the range from about 0.1 m to about 5 m, e.g. in the range from about 1 m to about 4 m, and also a length, i.e. an extension in the direction of its lateral extension transverse to the width (e.g. parallel to the transport direction), of more than 0.01 m, e.g. more than 0.1 m, e.g. more than 1 m, e.g. more than 10 m (the foil structure 302 can then, for example, be transported from roll to roll), e.g. more than 50 m, e.g. more than 100 m, e.g. more than 500 m.

For example, the material vapor source or the plurality of material vapor sources can have one or more tubular cathodes for sputtering, having a width in the range from about 1 m to about 5 m. For example, the irradiation source can include or be formed by one or more gas discharge tubes, with a diameter in the range from about 2 cm to about 50 cm and a length in the range from about 1 m to about 5 m.

Figure 4B:
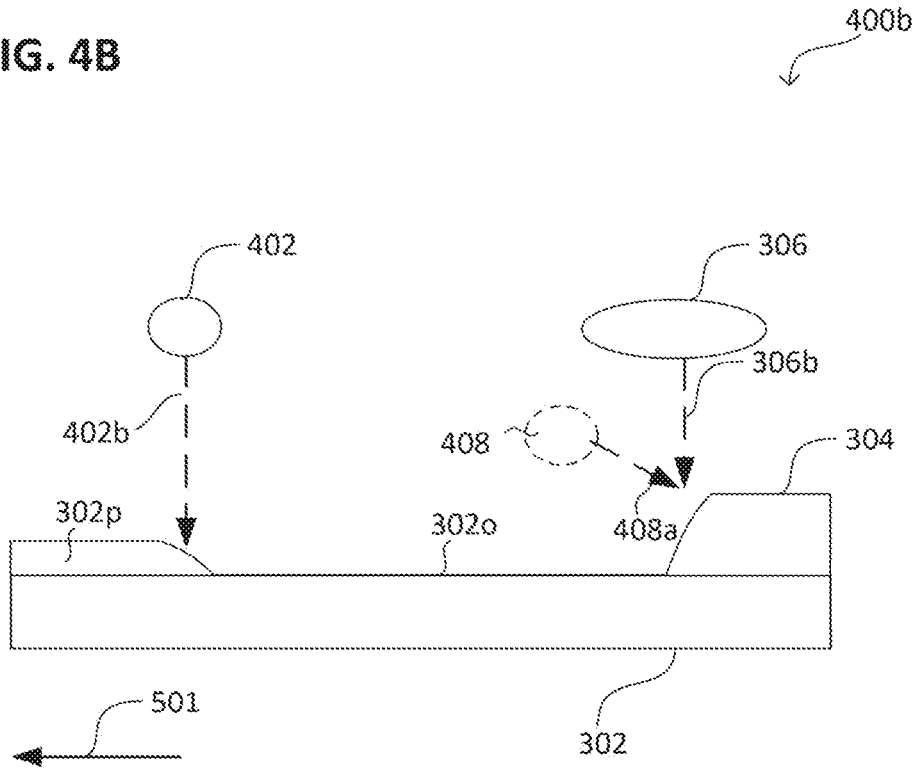

FIG. 4B shows a foil structure 302 in a process 400b according to various embodiments in a schematic side view or a schematic cross-sectional view.

If the foil structure has a passivating layer, a removal of a surface layer 302p of the foil structure 302 can be carried out according to various embodiments. For example, the surface layer 302p can include or be formed by a natural passivating layer which the foil structure forms automatically, e.g. in air. As an alternative or in addition, the surface layer 302p can include or be formed by impurities, e.g. deposits (e.g. impurities, dust, organics) on the foil structure 302.

The passivating layer can, for example, include or be formed by at least one metal oxide of the metal of the foil structure 302, i.e. the foil structure 302 can illustratively be oxidized.

The removal of the surface layer 302p can be carried out using an etching apparatus 402, e.g. an ion beam source, a plasma source and/or an etching gas source.

For example, a natural oxide layer of the foil structure 302, e.g. a metal foil 302 or a metal-coated foil, can be removed, e.g. by means of a plasma 402b (also referred to as plasma etching), by means of an ion beam 402b (also referred to as ion beam etching) or a chemical reaction 402b (e.g. by means of a suitable etching gas, also referred to as chemical dry etching), before formation of the layer 304. An electrical transition resistance between the applied layer 304 and the foil structure 302 can be reduced by removal of the oxide layer.

The metal of the foil structure 302 can have been or be at least partly exposed by the removal of the surface layer 302p. In other words, a metal surface can have been or be formed by the removal of the surface layer 302p.

The exposed metal surface can subsequently be coated. In other words, the layer 304 can be formed on the metal surface.

The removal of the surface layer 302p enables the chemical reactivity of the foil structure 302 to be increased, e.g. to be greater than the chemical reactivity of the passivating layer. This can bring about a chemical reaction between the layer 304 and the metal surface of the foil structure 302. For example, carbides, alloys or intermetallic compounds can be formed at the interface of the layer 304 and the foil structure 302, depending on the material of which the layer 304 is composed.

The chemical reaction between the layer 304 and the metal surface of the foil structure 302 can also be promoted further by use of an elevated foil temperature (i.e. by means of substrate heating), e.g. to a greater extent, the greater the foil temperature. A high foil temperature can optionally promote the growth of a dense (i.e. essentially pore-free) microstructure.

As an alternative or in addition, the chemical reaction between the layer 304 and the metal surface of the foil structure 302 can be promoted further by use of an increased kinetic energy of the material vapor 306b, e.g. to a greater extent, the higher the kinetic energy of the material vapor 306b. For example, it is possible to use sputtering to generate material vapor 306b which illustratively has a particularly high kinetic energy.

This can produce a chemical connection between the foil structure 302 and the layer, which has strong bond character (i.e. has strong chemical bonds). For example, carbides can be formed (carbide bonding) between a layer including carbon and a metal surface (e.g. the foil structure 302).

As an alternative or in addition, the chemical reaction between the layer 304 and the metal surface of the foil structure 302 can be promoted further by use of plasma activation 408a of the material vapor 306b. For this purpose, it is possible to use, for example, a plasma source 408 (e.g. an anode-cathode pair) in order to bring about plasma formation in the material vapor 306b (also referred to as plasma activation of the vapor).

Figure 5A:
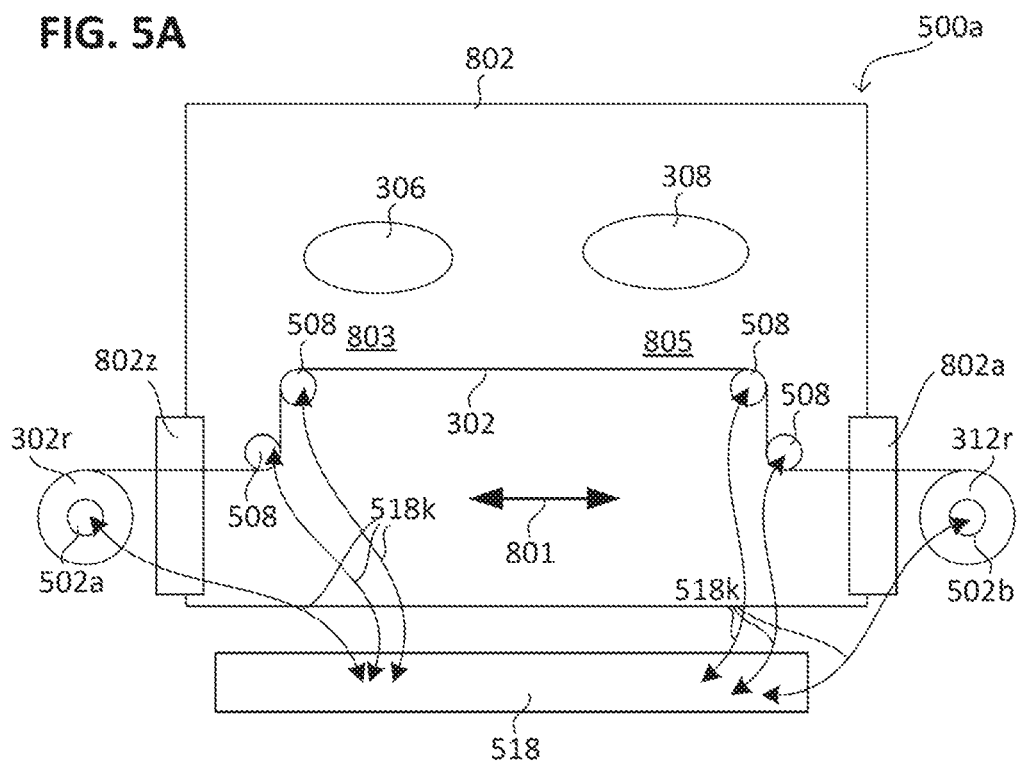
FIG. 5A and FIG. 5B in each case a coating arrangement according to various embodiments in a schematic side view or a schematic cross-sectional view.

FIG. 5A shows a coating arrangement 500a according to various embodiments in a schematic side view or a schematic cross-sectional view.

According to various embodiments, the coating arrangement 500a can have a vacuum chamber 802 which can be equipped for generating a vacuum.

For this purpose, the vacuum chamber 802 can be coupled to a pump system (not shown, having at least one high vacuum pump) so that a vacuum (i.e. a pressure of less than 0.3 bar) and/or a pressure in the range from about $10^{-3}$ mbar to about $10^{-7}$ mbar (in other words high vacuum) or a pressure lower than high vacuum, e.g. less than about $10^{-7}$ mbar (in other words ultrahigh vacuum) can have been or be provided within the vacuum chamber 802.

Furthermore, the vacuum chamber 802 can be configured in such a way that the ambient conditions (the process conditions) within the vacuum chamber 802 (e.g. pressure, temperature, gas composition, etc.) can be set or regulated, e.g. during coating. The vacuum chamber 802 can for this purpose have been or be, for example, made airtight, dust-tight and/or vacuum-tight. For example, a gas can be introduced by means of a gas feed conduit into the vacuum chamber 802 in order to form a process atmosphere in the vacuum chamber 802.

A coating region 803 can be arranged in the vacuum chamber 802. Furthermore, a material vapor source 306 for producing material vapor in the coating region 803 can be arranged in the vacuum chamber 802. The material vapor source 306 can produce the material vapor in such a way that the latter can spread into the coating region 803. For example, the material vapor can flow into the coating region 803.

An irradiation region 805 can optionally be arranged in the vacuum chamber 802. In this case, the coating arrangement 500a can have an irradiation source 308 which generates energy pulses (e.g. light flashes or an electron beam) and emits into the irradiation region 805 so that a foil structure 302 can be irradiated by means of the energy pulses in the irradiation region 805.

Furthermore, the vacuum chamber 802 can have an entry region 802z and an exit region 802a, with the foil structure 302 being able to be transported, for example along a direction 801, through the entry region 802z and into the vacuum chamber 802 and through the exit region 802a out from the vacuum chamber 802. Furthermore, the foil structure 302 can be transported through the coating region 803 and optionally through the irradiation region 805, for example along a substrate transport direction 801.

The material vapor source 306 can include at least one of the following: a sputtering source (e.g. a magnetron), a laser beam vaporizer, an electron beam vaporizer, a thermal vaporizer (e.g. an induction vaporizer or a resistance vaporizer), an ion beam vaporizer or an electric arc vaporizer.

The irradiation source 308 can, as described above, include, for example, one of the following: an electron beam source, a gas discharge lamp, an X-ray source, a laser (e.g. a continuously operated laser or a laser operated in pulses), a light-emitting diode, a proton beam source or a flashgun bulb.

Furthermore, the coating arrangement 500a can a winding-off roller 502a for winding off the foil structure 302, which is introduced into the coating region 803 (e.g. into the vacuum chamber 802), from a first roll 302r. The coating arrangement 500a can also have a winding-up roller 500a for winding up the foil structure 302, which travels out from the coating region 803, on to a second roll 312r.

Furthermore, the coating arrangement 500a can have a plurality of transport rollers 508 which define a transport path (line of the foil structure 302) along which the foil structure 302 is transported through the coating region between the winding-off roller 502a and the winding-up roller 502b.

Furthermore, the coating arrangement 500a can have a drive system 518 which is coupled at least to a majority of the plurality of transport rollers 508 of the winding-off roller 502a and the winding-up roller 502b. For example, the drive system 518 can be coupled by means of chains, belts or cog wheels to the rollers 508, 502a, 502b (i.e. each of the transport rollers of the majority of the plurality of transport rollers 508, of the winding-off roller 502a and the winding-up roller 502b).

A majority of the plurality of transport rollers 508 can be understood to mean more than about 50% of the transport rollers of the plurality of transport rollers 508, e.g. more than about 60% of the transport rollers of the plurality of transport rollers 508, e.g. more than about 70% of the transport rollers of the plurality of transport rollers 508, e.g. more than about 80% of the transport rollers of the plurality of transport rollers 508, e.g. more than about 90% of the transport rollers of the plurality of transport rollers 508, e.g. about 100% of the transport rollers of the plurality of transport rollers 508.

The plurality of transport rollers 508 can include more than 3, e.g. more than 5, e.g. more than about 10, e.g. more than about 20, e.g. more than about 50, e.g. more than about 100, transport rollers. The longer the transport path, the more transport rollers can be required.

In this way, it is possible to obtain a cylindrical surface speed, i.e. a speed at which the cylindrical surface of the rollers 508, 502a, 502b moves, which is essentially constant, e.g. at least over a period of time (e.g. one or more seconds). In this way, a uniform advance movement of the foil structure 302 can be produced. This prevents the foil structure 302, which has a low mechanical strength, from being stretched or even rupturing. In other words, the advance movement of the foil structure 302 through the coating region 803 or through the vacuum chamber 802 is actively assisted by each of the rollers 508, 502a, 502b. In various embodiments, the drive system can have a synchronizing unit for synchronizing the cylindrical surface speed of the powered rollers.

In various embodiments, at least the majority of the plurality of transport rollers 508 can have at least one deflection roller for deflecting the transport path transverse to an axis of rotation of the deflection roller.

Furthermore, at least the majority of the plurality of transport rollers can have at least one transverse stretching roller for tensioning the foil structure 302 along an axis of rotation of the transverse stretching roller. A transverse stretching roller can, for example, have a spiral profile on its cylindrical surface or be slightly curved so that foil structure 302 running over it is tensioned outward. Formation of creases in the foil structure 302 can be inhibited in this way.

In various embodiments, the coating arrangement 500a can optionally include one or more etching devices (not shown) by means of which the removal of a surface layer of the foil structure 302 occurs. Thus, the surface of the foil structure 302 can illustratively be etched. The one or more etching gas apparatuses can include or be formed by one or more ion beam sources, one or more plasma sources and/or one or more etching gas sources.

As shown in FIG. 5A, the winding-off roller 502a and the winding-up roller 502b can be arranged outside the vacuum chamber 802. For example, the entry region 802z and/or the exit region 802a can have a slit through which the foil structure 302 is transported. For example, the entry region 802z and/or the exit region 802a can be coupled (in respect of vacuum) to further chambers, e.g. prevacuum chambers or vacuum chambers which can together be part of a strip coating plant.

Figure 5B:
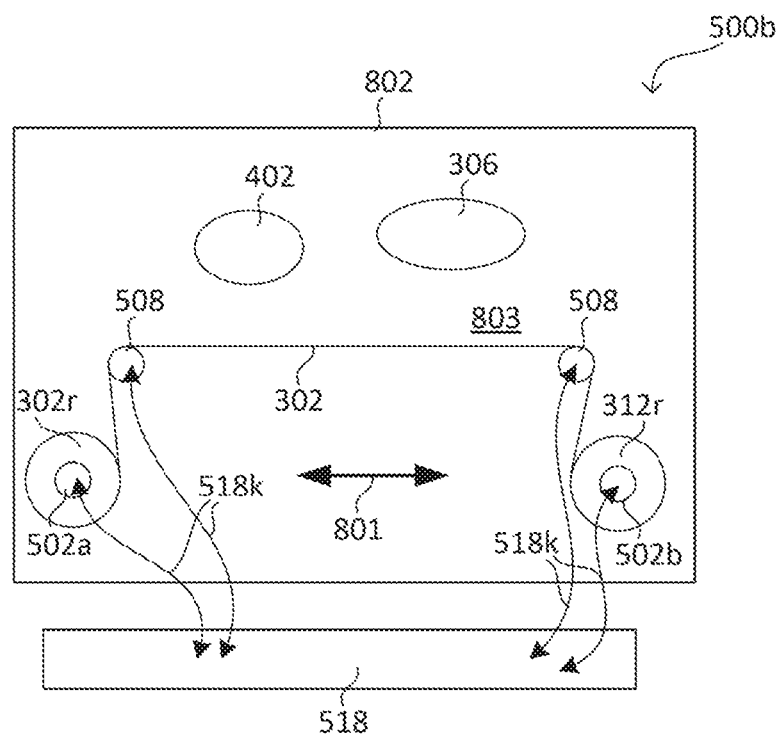

FIG. 5B shows a coating arrangement 500a according to various embodiments in a schematic side view or a schematic cross-sectional view.

As shown in FIG. 5A, the winding-off roller 502a and the winding-up roller 502b can be arranged within the vacuum chamber 802.

In this case, the vacuum chamber 802 can have an opening (not shown) and a lid closing the opening. When the lid is opened, the interior of the vacuum chamber 802 can be serviced through the opening, and, for example, the rollers 302r, 312r can be replaced.

Figure 6:
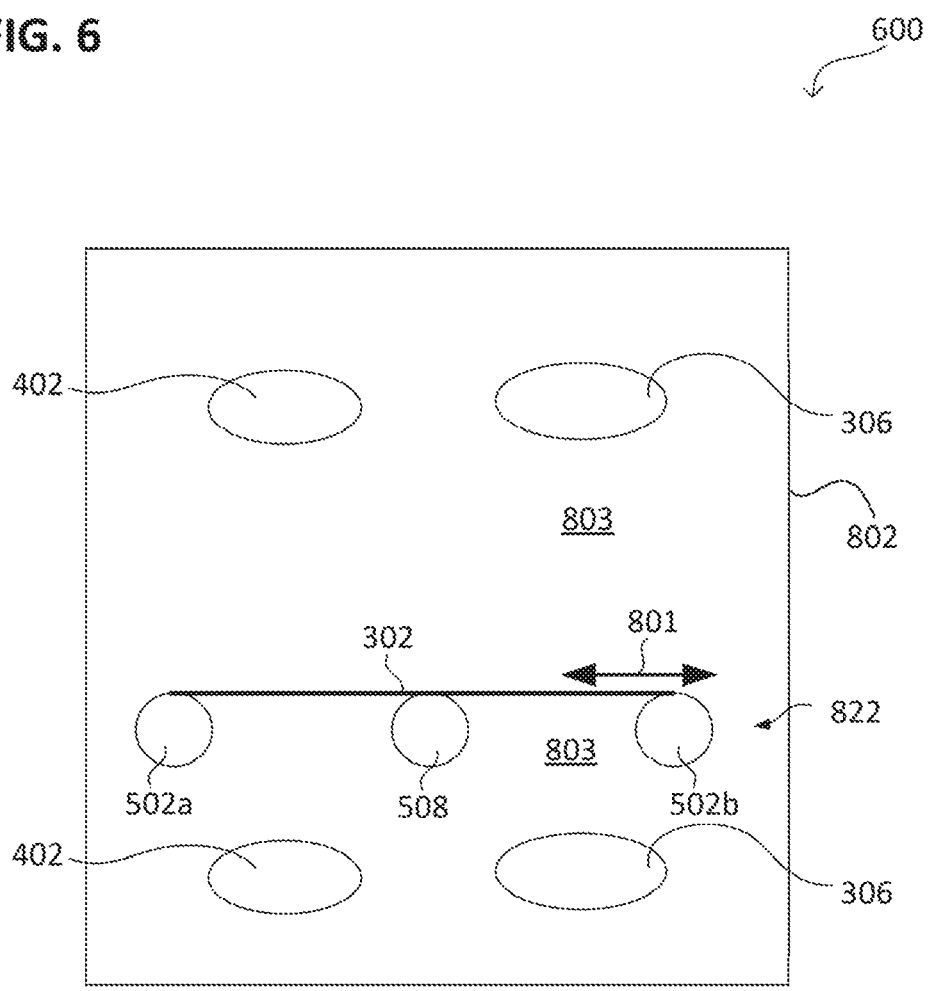
FIG. 6 a coating arrangement according to various embodiments in a schematic side view or a schematic cross-sectional view.

FIG. 6 shows in each case a coating arrangement 600 according to various embodiments in a schematic side view or a schematic cross-sectional view.

The coating arrangement 600 shown in FIG. 6 corresponds largely to the coating arrangement 500b shown in FIG. 5B, with the foil structure 302 being coated on both sides. The foil structure 302 can be a metal foil and/or a metal-coated film, e.g. a metal-coated polymer film, e.g. which has the metal surface to be coated.

The coating arrangement 600 shown in FIG. 6 can be configured for coating the foil structure 302, e.g. in a vacuum. For this purpose, the coating arrangement 600 can have a vacuum chamber 802. The vacuum chamber 802 can be equipped for providing a vacuum.

The coating arrangement 600 can also have two material vapor source arrangements 306 arranged in the vacuum chamber 802 for coating the foil structure 302.

The coating arrangement 600 can also have two irradiation apparatuses (not shown) arranged in the vacuum chamber 802 for the pulsed irradiation of the carbon-containing layers. The irradiation apparatuses can be configured so that the layers (e.g. applied on both sides) can be heated by means of the pulsed irradiation. For this purpose, the irradiation apparatuses can generate and emit radiation having a sufficient energy.

The material vapor source arrangement 600 can also have a transport apparatus 822 for transporting the foil structure 302. The transport apparatus 822 can, for example, have a plurality of transport rollers 508 on which the foil structure 302 can be transported.

The transport apparatus 822 can be equipped and arranged in such a way that it can transport the foil structure 302 along a transport path (e.g. along the direction 801) which is defined by the arrangement of the transport rollers 508 relative to one another. The foil structure 302 can be transported through the coating region 803 and through the irradiation region.

The transport apparatus 822 can be equipped and arranged in such a way that it transports the foil structure 302 between and through the two material vapor source arrangements 804. In other words, the transport path runs between and through the two material vapor source arrangements 804.

The transport apparatus 822 can be equipped and arranged in such a way that it transports the foil structure 302 between and through the two material vapor source arrangements. In other words, the transport path runs between and through the two material vapor source arrangements.

The transport apparatus 822 can be equipped and arranged in such a way that it transports the foil structure 302 between and through the two etching apparatuses 402. In other words, the transport path runs between and through the two etching apparatuses 402.

Figure 7:
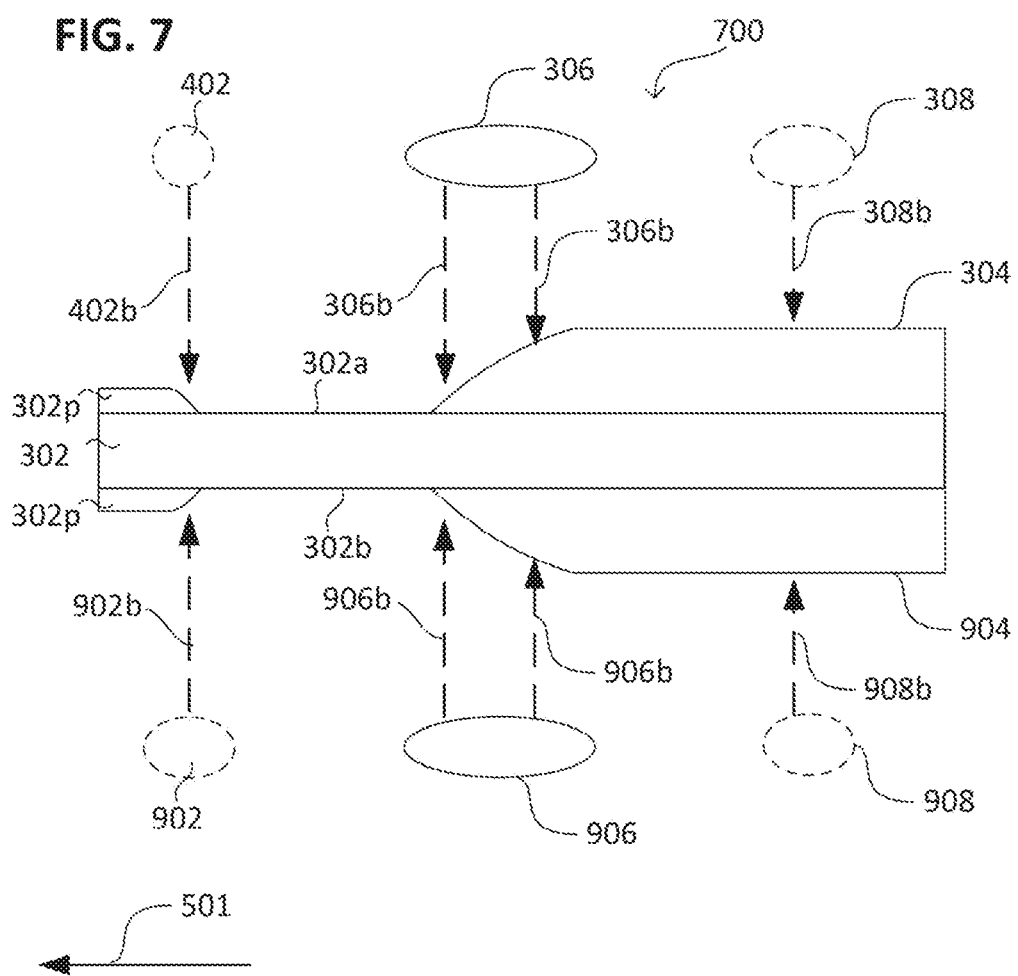
FIG. 7 a process according to various embodiments in a schematic side view or a schematic cross-sectional view.

FIG. 7 shows a foil structure 302 in a process 700 according to various embodiments in a schematic side view or a schematic cross-sectional view.

In various embodiments, a first layer 304 can be formed on or above an upper side 302a, or on a metal surface on the upper side 302a, of the foil structure 302 and a second layer 904 can be formed on or below an underside 302b, or on a metal surface on the underside 302b, of the foil structure 302. The formation of the first layer 304 and the formation of the second layer 904 can occur essentially simultaneously or with a time difference.

The formation of the first layer 304 can be effected by means of a first material vapor source arrangement 306 (having, for example, one or more first material vapor sources) using a first material vapor 306b and the formation of the second layer 904 can be effected by means of a second material vapor source arrangement 906 (having, for example, one or more second material vapor sources) using a second material vapor 906b.

A first surface layer 302p can optionally be removed from the upper side 302a of the foil structure 302 (first removal 402b) and, as an alternative or in addition, a surface layer 302p can be removed from the underside 302b of the foil structure 302 (second removal). The removal 402b of the first surface layer 302p can be carried out using a first etching apparatus 402 and the removal 402b of the second surface layer 302p can be carried out using a second etching apparatus 902. In this way, the metal surface on the upper side 302a of the foil structure 302 can be exposed by means of the first removal 402b and, as an alternative or in addition, the metal surface on the underside 302b of the foil structure 302 can be removed by means of the second removal 902b.

The first layer 304 and, as an alternative or in addition, the second layer 904 can optionally be irradiated in pulses 308b, 908b. The irradiation 308b of the first layer 304 can be carried out using a first irradiation arrangement 308 and, as an alternative or in addition, the irradiation 908b of the second layer 904 can be carried out using a second irradiation arrangement 908.

The irradiation 308b of the first layer 304 can be carried out in such a way that the first layer 304 is at least partially structurally altered. As an alternative or in addition, the irradiation 908b of the second layer 904 can be carried out in such a way that the second layer 904 is at least partially structurally altered.

For example, the pulsed irradiation 308b, 908b of the first layer 304 and of the second layer 904 can be carried out essentially simultaneously. In this way, the stressing of the foil structure 302 by the input of heat (also referred to as thermal stressing) on the upper side 302a thereof and the underside 302b thereof can be substantially equalized.

For the purposes of the present disclosure, substantially equalized means that the mechanical stresses within the upper side 302a of the foil structure 302 and the mechanical stresses within the underside 302b of the foil structure 302 are substantially the same, in a manner analogous to the first energy and the second energy, as described above.

For the purposes of the present disclosure, substantially simultaneously means that the irradiation 308b of the first layer 304 (also referred to as first irradiation 308b) occurs with a time shift (in other words with a time offset) relative to the irradiation 908b of the second layer 904 (also referred to as second irradiation 908b) which is smaller than the duration of the first irradiation 308b and/or of the second irradiation 908b. The time shift can, for example, be defined by the time difference between the commencement of the first irradiation 308b and the commencement of the second irradiation 908b.

In other words, the first irradiation 308b and the second irradiation 908b can overlap, e.g. to an extent of more than about 70%, e.g. to an extent of more than about 80%, e.g. to an extent of more than about 90%.

In various embodiments, the foil structure 302 can be transported continuously during the irradiation 308b, 908b, during coating and/or during removal of the surface layer (analogously also through the coating region 803).

The first layer 304 and/or the second layer 904 can, for example, include or be formed by one or more of the following: an NiCr alloy, carbon, a carbon/metal mixture, a carbon/metal nitride mixture, a carbon/metal carbide mixture, a composition gradient.

Instead of the first material vapor 306b, a material vapor mixture can optionally be employed using a plurality of material vapor sources 306 (as part of a material vapor source arrangement). Instead of the second material vapor 306b, a material vapor mixture can optionally be employed using a plurality of material vapor sources 906 (as part of a material vapor source arrangement).

Figure 8:
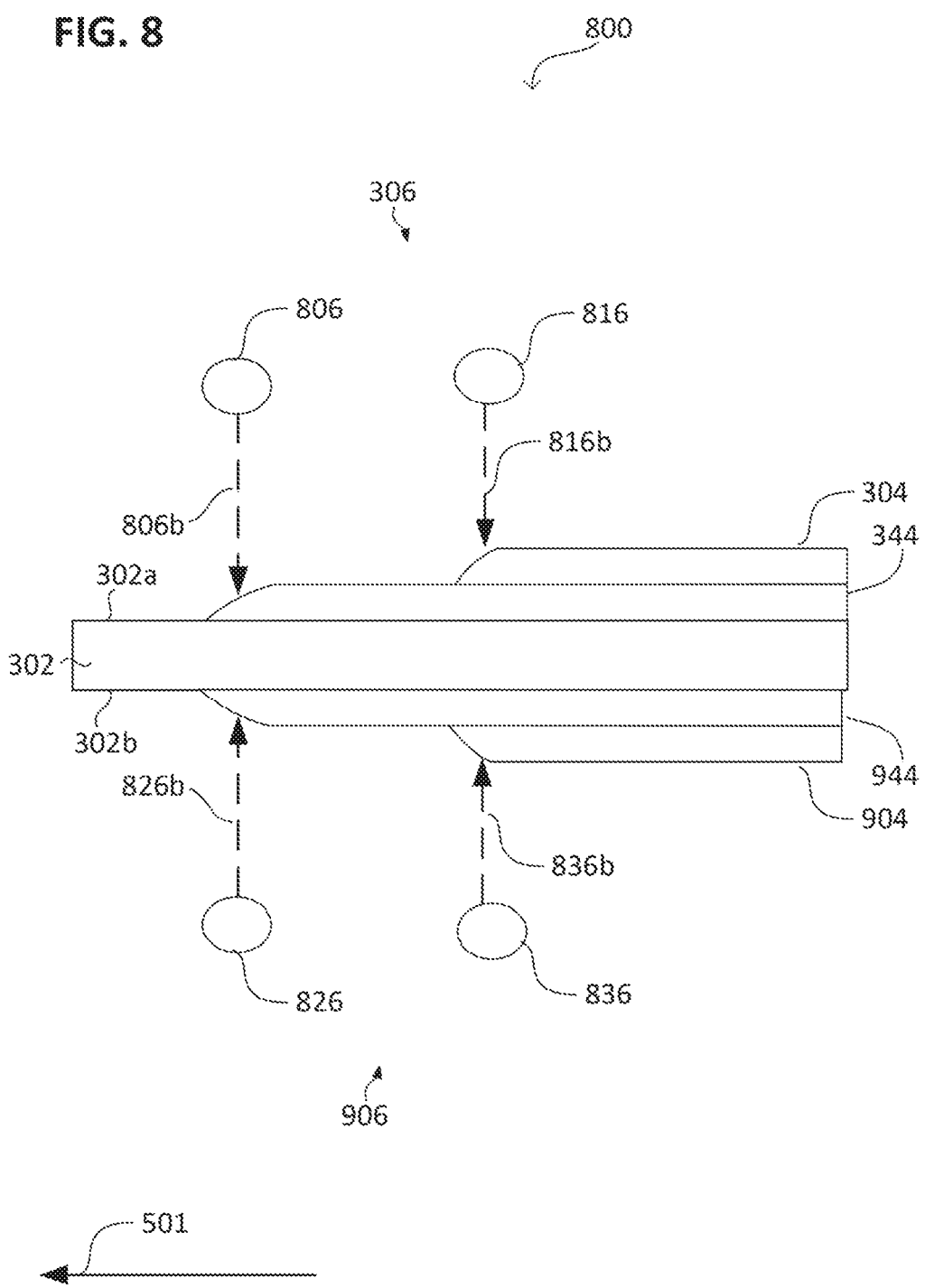
FIG. 8 a process according to various embodiments in a schematic side view or a schematic cross-sectional view.

FIG. 8 shows a foil structure 302 in a process 800 according to various embodiments in a schematic side view or a schematic cross-sectional view.

In various embodiments, a first material vapor source arrangement 306 can have at least one first material vapor source 806 which produces first material vapor 806b and at least one second material vapor source 816 which produces second material vapor 816b.

In an analogous way, a second material vapor source arrangement 906 can have at least one first material vapor source 826 which produces first material vapor 826b and at least one second material vapor source 836 which produces second material vapor 836b.

The first material vapor 806b from the first material vapor source arrangement 306 can be used for forming a first layer 344 on the upper side 302a of the foil structure 302 and the first material vapor 826b from the second material vapor source arrangement 906 can be used for forming a first layer 944 on the underside 302b of the foil structure 302. In other words, a first layer 344 on the upper side 302a of the foil structure 302 can be formed from the first material vapor 806b from the first material vapor source arrangement 306 and a first layer 944 can be formed on the underside 302b of the foil structure 302 from the first material vapor 826b from the second material vapor source arrangement 906.

The second material vapor 816b from the first material vapor source arrangement 306 can be used for forming a second layer 304, e.g. on or above the first layer 344, on the upper side 302a of the foil structure 302 and the second material vapor 836b from the second material vapor source arrangement 906 can be used for forming a second layer 944, e.g. on or below the first layer 944, on the underside 302b of the foil structure 302. In other words, a second layer 304 can be formed on the upper side 302a of the foil structure 302 from the second material vapor 816b from the first material vapor source arrangement 306 and a second layer 904 can be formed on the underside 302b of the foil structure 302 from the second material vapor 836b from the second material vapor source arrangement 906.

The first layer 344 on the upper side 302a of the foil structure 302 can also be referred to as buffer layer 344 and the second layer 304 on the upper side 302a of the foil structure 302 can also be referred to as protective layer 304. The first layer 944 on the underside 302b of the foil structure 302 can also be referred to as buffer layer 944 and the second layer 904 on the underside 302b of the foil structure 302 can also be referred to as protective layer 904.

A removal of a surface layer from the upper side 302a and/or from the underside 302b of the foil structure 302 can optionally be carried out, as described above, before coating by means of the first material vapor source arrangement 306 and/or the first material vapor source arrangement 906.

The first layer 344 on the upper side 302a of the foil structure 302 and/or the first layer 944 on the underside 302b of the foil structure 302 can, for example, include or be formed by one or more of the following: a metal, a metal nitride, a metal carbide, a carbon/metal mixture, a carbon/metal nitride mixture, a carbon/metal carbide mixture, a composition gradient.

The second layer 304 on the upper side 302a of the foil structure 302 and the second layer 904 on the underside 302b of the foil structure 302 can, for example, include or be formed by one or more of the following: an NiCr alloy, carbon, a carbon/metal mixture, a carbon/metal nitride mixture, a carbon/metal carbide mixture, a composition gradient.

The first layer 344 on the upper side 302a of the foil structure 302 and/or the first layer 944 on the underside 302b of the foil structure 302 can, for example, include or be formed by titanium, and the second layer 304 on the upper side 302a of the foil structure 302 and the second layer 904 on the underside 302b of the foil structure 302 can, for example, include or be formed by an amorphous carbon layer (i.e. the carbon is, for example, present in an amorphous carbon configuration and/or tetrahedral-amorphous carbon configuration).

The above-described coating operation can optionally be carried out only on the upper side 302a of the foil structure 302 or can only be carried out on the underside 302b of the foil structure 302. The foil structure 302 is in this case illustratively coated on one side.

The first layer and the second layer can in each case form a layer stack on the upper side 302a and the underside 302b. One of the layers can optionally be formed using a material vapor mixture.

Figure 9:
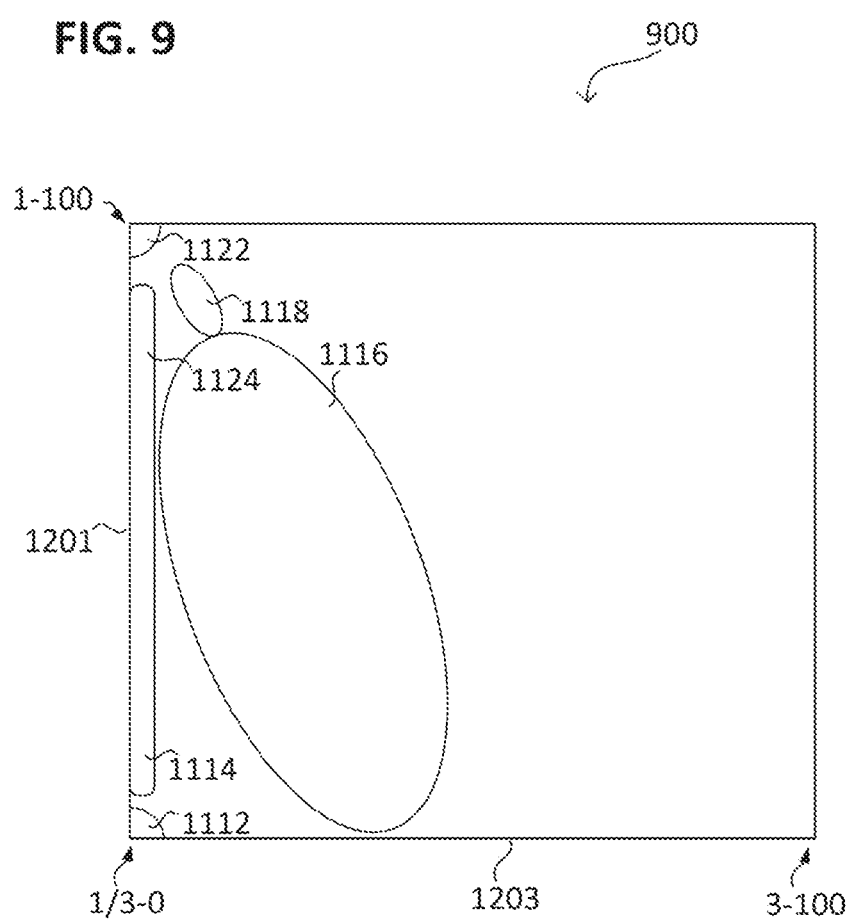
FIG. 9 a schematic diagram of structural properties of a layer in a process according to various embodiments.

FIG. 9 shows a schematic diagram 900 of structural properties of a layer which includes or is formed by carbon in a process according to various embodiments.

In the diagram 900, the axis 1201 shows the relative proportion of $sp^3$-hybridized carbon in the layer. The relative proportion of $sp^3$-hybridized carbon can be defined by the ratio of the number of $sp^3$-hybridized carbon atoms to the sum of $sp^2$-hybridized carbon atoms and $sp^3$-hybridized carbon atoms in the layer. Furthermore, the axis 1201 shows the atomic proportion of hydrogen in the layer.

The point ⅓-0 corresponds to a relative proportion of $sp^3$-hybridized carbon in the layer of 0% and an atomic proportion of hydrogen in the layer of 0%. The point 1-100 corresponds to a relative proportion of $sp^3$-hybridized carbon in the layer of 100% and an atomic proportion of hydrogen in the layer of 0%. The point 3-100 corresponds to a relative proportion of $sp^3$-hybridized carbon in the layer of 0% and an atomic proportion of hydrogen in the layer of 100%.

The region 1112 represents a layer composition in which graphite is formed, i.e. the carbon in the layer is present mainly or completely in the graphite configuration. The region 1114 represents a layer composition in which amorphous carbon is formed, i.e. the carbon in the layer is present mainly or completely in the amorphous configuration. The region 1116 represents a layer composition in which hydrogenated amorphous carbon is formed, i.e. the carbon in the layer is present mainly or completely in the amorphous configuration and has additionally taken up hydrogen. The region 1118 represents a layer composition in which tetragonal carbon is formed, i.e. the carbon in the layer is present mainly or completely in the tetragonal configuration. The region 1122 represents a layer composition in which diamond is formed, i.e. the carbon in the layer is present mainly or completely in the diamond configuration.

In this context, the term "mainly" can be understood to mean that more than 90% of the carbon atoms are present in a particular configuration.

For the purposes of the present description, the above-described configurations of carbon can be regarded as inorganic.

In various embodiments, a foil structure 302 in the form of an Al foil or in the form of an Al-coated film (e.g. an Al-coated polymer film) can, according to various embodiments, have been or be coated with a protective layer 304, as has been described above. A buffer layer (not shown) can optionally have been or be formed between the protective layer 304 and the foil structure 302.

The protective layer 304 can, according to various embodiments, include or be formed by carbon. As an alternative, the protective layer 304 can, according to various embodiments, include or be formed by nickel and chromium, e.g. an NiCr alloy.

After coating, the foil structure can have been or be wound up to form a roll 312r.

In various embodiments, a foil structure 302 in the form of a Cu foil or in the form of a Cu-coated foil structure (e.g. a Cu-coated polymer film) can, according to various embodiments, have been or be coated with a protective layer 304, as described above. A buffer layer (not shown) can optionally have been or be formed between the protective layer 304 and the foil structure 302.

The protective layer 304 can, according to various embodiments, include or be formed by carbon. As an alternative, the protective layer 304 can, according to various embodiments, include or be formed by nickel and chromium, e.g. an NiCr alloy.

After coating, the foil structure can have been or be wound up to form a roll 312r.

Figure 10:
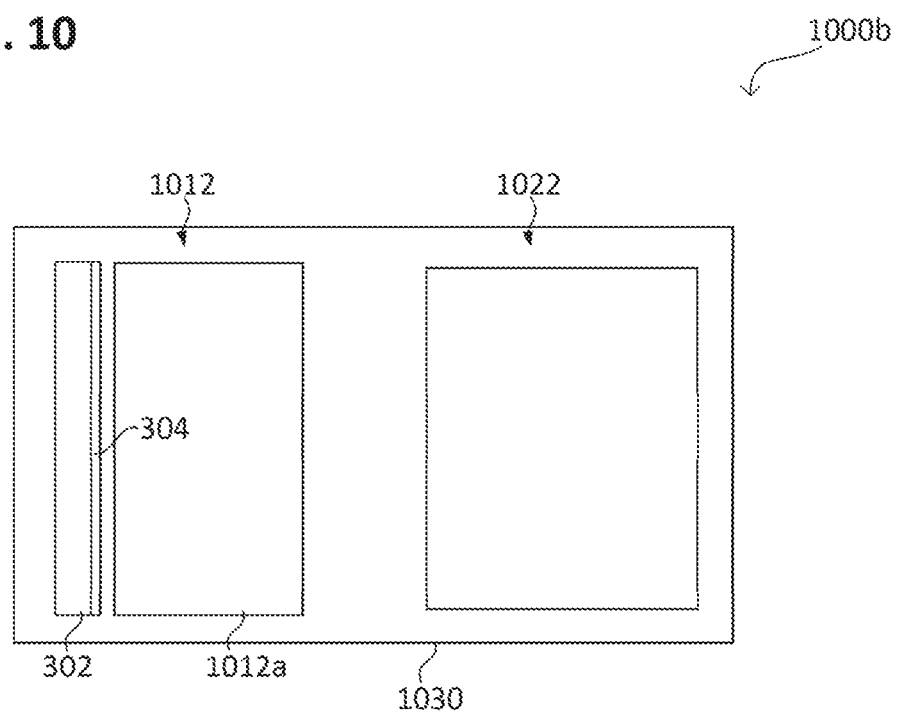
FIG. 10 an energy storage in a process according to various embodiments in a schematic side view or a schematic cross-sectional view.

FIG. 10 shows an energy storage 1000b in a process according to various embodiments in a schematic side view or a schematic cross-sectional view.

The energy storage 1000b can, according to various embodiments, have a first electrode 1012 which has a first chemical potential. The first electrode 1012 can include a foil structure 302 (e.g. an electrically conductive foil 302) which has a thickness of less than 40 μm, e.g. less than about 35 μm, e.g. less than about 30 μm, e.g. less than about 25 μm, e.g. less than about 20 μm, e.g. less than about 15 μm, e.g. less than about 10 μm, e.g. less than about 5 μm, e.g. in the range from about 10 μm to about 30 μm.

Furthermore, the first electrode 1012 can include an active material 1012a which is arranged on the foil structure 302, with the active material 1012a of the first electrode 1012 providing the first chemical potential of the first electrode 1012. The active material 1012a can, for example, include or be formed by lithium-iron phosphate (LFPO) (e.g. in a lithium-iron phosphate energy storage 1000b), include or be formed by lithium-manganese oxide (LMO) (e.g. in a lithium-manganese oxide energy storage 1000b) or include or be formed by lithium titanate (LTO) (e.g. in a lithium titanate energy storage 1000b). In the case of a lithium ion energy storage 1000b, the active material 1012a can also be referred to as lithium compound active material 1012a.

Furthermore, the first electrode 1012 can include a layer 304, e.g. an electrically conductive layer, e.g. in the form of a contact layer, which is arranged between the foil structure 302 and the active material, with the layer 304 of the first electrode 1012 having a contiguous microstructure which covers at least a major part of the foil structure 302 and/or with the layer 304 having a microstructure having strong chemical bonds to the foil structure 302. The layer 304 of the first electrode 1012 can be in at least partial (i.e. partial or complete) physical contact with the foil structure 302 of the first electrode 1012.

Furthermore, the energy storage 1000b can have a second electrode 1022 which has a second chemical potential.

Furthermore, the energy storage 1000b can have an encapsulation 1030 which surrounds the first electrode 1012 and the second electrode 1022.

An electrical potential can arise between the first electrode 1012 and the second electrode 1022, e.g. when the energy storage 1000b has been or is charged, which corresponds approximately to the difference between the first chemical potential and the second chemical potential.

Such an energy storage 1000b can also be referred to as energy storage cell 1000b. As an alternative, an energy storage can include a plurality of the above-described arrangements, so that it has a plurality of energy storage cells 1000b.

The foil structure 302 can illustratively be functioned as current collector or power outlet lead for tapping the electric charges which result due to ion exchange between the first electrode of the first electrode 1012 and the second electrode 1022, e.g. when the energy storage 1000b discharges. The ions which move between the first electrode 1012 and the second electrode 1022 (ion exchange) can bring about conversion of stored chemical energy (e.g. when the energy storage 1000b is in the charged state) into electric energy, with the electric energy providing an electrical potential at the contacts 1012k, 1022k.

In various embodiments, an electrical potential of more than about 1.2 volt (V) can be provided, e.g. more than about 4 V. The higher the electrical potential, i.e. the greater the difference between the first chemical potential and the second chemical potential, the greater can the chemical resistance of the foil structure 302, e.g. by means of the layer 304, which is required be.

For example, a layer 304 which includes or is formed by amorphous carbon can be used for an electrical potential of more than about 4 V. Electrical potentials of more than about 4 V are achieved, for example, by means of electrodes including lithium titanate (for example as part of the anode).

In various embodiments, the foil structure 302 of the first electrode 1012 can have been or be coated on both sides, as described above. In other words, the foil structure 302 of the first electrode 1012 can have the layer 304 on the upper side and on the underside.

In various embodiments, the active material (e.g. in the form of a liquid phase, i.e. dissolved in a solvent) can have been or be applied to the foil structure 302 by means of a strip coating plant, e.g. by means of liquid phase deposition, for example by means of spray coating, curtain coating and/or slot die coating.

Remaining solvent can optionally be removed from the active material in a subsequent drying process (in which the foil structure 302 is heated).

Figure 11:
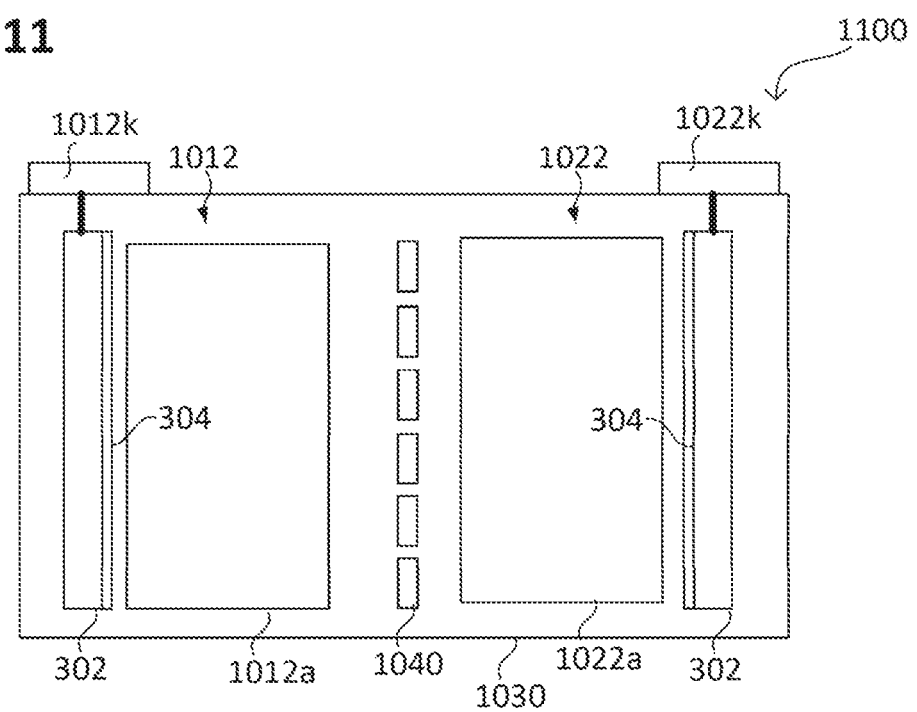
FIG. 11 an energy storage in a process according to various embodiments in a schematic side view or a schematic cross-sectional view.

FIG. 11 shows an energy storage 1100 in a process according to various embodiments in a schematic side view or a schematic cross-sectional view.

In various embodiments, the second electrode 1022 can have been or be configured in a manner analogous to the first electrode 1012, as described in more detail in the following.

The second electrode 1022 can include a foil structure 302 (e.g. an electrically conductive foil structure 302) which has a thickness of less than 40 µm, e.g. less than about 35 µm, e.g. less than about 30 µm, e.g. less than about 25 µm, e.g. less than about 20 µm, e.g. less than about 15 µm, e.g. less than about 10 µm, e.g. less than about 5 µm, e.g. in the range from about 10 µm to about 30 µm.

The second electrode 1022 can further include an active material 1022a which is or has been arranged on the foil structure 302 of the second electrode 1022, with the active material 1022a of the second electrode 1022 providing the second chemical potential of the second electrode 1022.

The active material 1022a of the second electrode 1022 (e.g. the anode) can differ from the active material 1012a of the first electrode 1012. The active material 1022a of the second electrode 1022 can, for example, include or be formed by graphite (or carbon in another configuration, for example), include or be formed by nanocrystalline and/or amorphous silicon, include or be formed by lithium titanate ($Li_4Ti_5O_{12}$) or include or be formed by tin dioxide ($SnO_2$).

Furthermore, the second electrode 1022 can include a layer 304, e.g. an electrically conductive layer, e.g. in the form of a contact layer, which is arranged between the foil structure 302 of the second electrode 1022 and the active material 1022a of the second electrode 1022, with the layer 304 of the second electrode 1022 having a contiguous microstructure which covers at least a major part of the foil structure 302 of the second electrode 1022 and/or with the layer 304 of the second electrode 1022 having a microstructure having strong chemical bonds to the foil structure 302 of the second electrode 1022. The layer 302 of the second electrode 1022 can be in at least partial (i.e. partial or complete) physical contact with the foil structure 302 of the second electrode 1022.

In various embodiments, the foil structure 302 of the second electrode 1022 can have been or be coated on both sides, as described above. In other words, the foil structure 302 of the second electrode 1022 can have the layer 304 on the upper side and on the underside.

The energy storage 1100 can further include a first contact 1012k which contacts the first electrode 1012 and is, for example, electrically connected to the foil structure 302 of the first electrode 1012. The first contact 1012k can have an exposed surface.

The energy storage 1100 can further include a second contact 1022k which contacts the second electrode 1022 and is, for example, electrically connected to the foil structure 302 of the second electrode 1022. The second contact 1022k can have an exposed surface.

An electrical potential can arise between the first contact 1012k and the second contact 1022k, e.g. when the energy storage 1100 is in the charged state, which corresponds approximately to the difference between the first chemical potential and the second chemical potential.

The energy storage 1100 can optionally include a separator 1040. The separator 1040 can physically and electrically separate the first electrode 1012 and the second electrode 1022, in other words the negative and positive electrode (i.e. cathode and anode), from one another. However, the separator 1040 can be permeable to ions which move between the first electrode 1012 and the second electrode 1022. The ions which move between the first electrode 1012 and the second electrode 1022 can bring about conversion of stored chemical energy (e.g. when the energy storage 1100 is in the charged state) into electric energy, with the electric energy proving an electrical potential at the contacts 1012$k$, 1022$k$. The separator 1040 can include or be formed by a microporous polymer and/or the separator can include or be formed by a nonwoven composed of glass fibers or polyethylene.

In various embodiments, a first electrode (e.g. an anode of an energy storage) can, for example, include the following: a foil structure 302 which has a thickness of less than 40 µm; an active material which is arranged on the foil structure 302, with the active material providing a first chemical of the electrode and the active material including or being formed by lithium titanate; a layer which is arranged between the foil structure 302 and the active material, with the layer having a contiguous microstructure which covers at least a major part of the foil structure 302 and/or with the layer having a microstructure having strong chemical bonds to the foil structure 302; with the layer 304 including or being formed by amorphous carbon.

As an alternative or in addition, a second electrode (e.g. a cathode of an energy storage) can, according to various embodiments, include the following: a foil structure 302 which has a thickness of less than 40 µm; an active material which is arranged on the foil structure 302, with the active material providing a first chemical of the electrode and the active material including or being formed by lithium-cobalt; a layer which is arranged between the foil structure 302 and the active material, with the layer having a contiguous microstructure which covers at least a major part of the foil structure 302 and/or with the layer having a microstructure having strong chemical bonds to the foil structure 302; with the layer 304 including or being formed by amorphous carbon.

In the following, various examples are disclosed:

Example 1 is a process (100*a*, 200*a*, 700, 800), including: transporting (110) of a foil structure (302) in a coating region in a vacuum chamber, wherein the foil structure (302) has a thickness of less than 40 µm; and coating (120) the foil structure (302) with a protective layer using a gaseous coating material; wherein the protective layer has a contiguous carbon microstructure.

Example 2 is the process (100*a*, 200*a*, 700, 800) as disclosed in example 1, wherein the foil structure (302) includes a laminate of at least one polymer and at least one metal; or wherein the foil structure (302) is formed by the metal; or wherein the foil structure (302) is formed by the polymer.

Example 3 is the process (100*a*, 200*a*, 700, 800) as disclosed in example 2, wherein the process (100*a*, 200*a*, 700, 800) further includes: removing a surface layer (302*p*) of the foil structure (302) to at least partly expose the metal of the foil structure (302), so that a metallic surface is formed.

Example 4 is the process (100*a*, 200*a*, 700, 800) as disclosed in any of examples 1 to 3, wherein the gaseous coating material includes a metal or semimetal.

Example 5 is the process (100*a*, 200*a*, 700, 800) as disclosed in any of examples 1 to 4, wherein the process (100*a*, 200*a*, 700, 800) further includes: coating of the foil structure (302) using a further gaseous coating material; wherein a first layer is formed using the gaseous coating material and wherein a second layer is formed using the further gaseous coating material; and/or wherein a joint layer is formed using the gaseous coating material and the further gaseous coating material, with the gaseous coating material and the further gaseous coating material being at least partially mixed with one another.

Example 6 is the process (100*a*, 200*a*, 700, 800) as disclosed in example 5, wherein the second layer is arranged between the first layer and the foil structure (302); and/or the second layer includes a metal carbide, a metal nitride and/or a metal.

Example 7 is the process (100*a*, 200*a*, 700, 800) as disclosed in any of examples 1 to 6, wherein the process (100*a*, 200*a*, 700, 800) further includes: generating energy pulses to heat the coating so that the latter is structurally altered.

Example 8 is the process (100*a*, 200*a*, 700, 800) as disclosed in any of examples 1 to 7, wherein the contiguous carbon microstructure covers at least a major part of the foil structure (302); and/or the contiguous carbon microstructure has strong chemical bonds to the foil structure.

Example 9 is the process (100*a*, 200*a*, 700, 800) as disclosed in any of examples 1 to 8, wherein the process (100*a*, 200*a*, 700, 800) further includes: applying an active material (1012*a*) on the foil structure to form a first electrode (1012) which has a first chemical potential; assembly of the first electrode (1012) with a second electrode (1022), where the second electrode (1022) has a second chemical potential; encapsulating the first electrode (1012) and the second electrode (1022).

Example 10 is using a foil structure (302) processed by means of a process (100*a*, 200*a*, 700, 800) as disclosed in any of examples 1 to 9 in an energy storage (1000*b*, 1100).

Example 11 is an energy storage (1000*b*, 1100) including: a first electrode (1012) which has a first chemical potential, wherein the electrode (1012) further includes: a support structure (302) which has a thickness of less than 250 µm; an active material (1012*a*) which is arranged on the support structure (302), with the active material (1012*a*) providing the first chemical potential of the first electrode (1012); a protective layer (304) which is arranged between the support structure (302) and the active material (1012*a*), with the protective layer (304) having a contiguous carbon microstructure which covers at least a major part of the support structure (302) and/or with the protective layer (304) having a carbon microstructure having strong chemical bonds to the support structure (302); a second electrode (1022) which has a second chemical potential; and an encapsulation (1030) which surrounds the first electrode (1012) and the second electrode (1022).

Example 12 is the energy storage (1000*b*, 1100) as disclosed in example 11, wherein the support structure (302) includes a foil structure (302) which has a thickness of less than 40 µm.

Example 13 is a coating arrangement including: a vacuum chamber (802) which has at least one coating region (803); at least one material vapor source (306) which is configured for producing material vapor in the coating region (803) in such a way that a contiguous carbon microstructure is formed by means of the material vapor; a winding-off roller (502*a*) for winding off a foil structure (302), which is introduced into the coating region (803), from a roll; a winding-up roller (502*b*) for winding up the foil structure (302), which is transported out of the coating region (803), to form a roll; a plurality of transport rollers (508) which define a transport path along which the foil structure (302) is transported through the coating region between the winding-off roller and the winding-up roller; and a drive system which is coupled to at least a majority of the plurality of transport rollers, the winding-off roller and the winding-up roller so as to produce a uniform advance movement of the foil structure (302); wherein the major part of the plurality of transport rollers has at least one deflection roller for deflecting the transport path perpendicular to an axis of rotation of the deflection roller and the majority of the plurality of transport rollers has at least one transverse stretching roller for tensioning the foil structure (302) along an axis of rotation of the transverse stretching roller.

The invention claimed is:

1. A process comprising:
   transporting of a foil structure in a coating region in a vacuum chamber, wherein the foil structure has a thickness of less than 40 μm; and
   coating the foil structure with a protective layer using a gaseous coating material;
   wherein the gaseous coating material comprises a metal;
   applying an active material on the foil structure to form a first electrode, wherein the first electrode comprises the foil structure and has a first chemical potential;
   assembly of the first electrode with a second electrode, where the second electrode has a second chemical potential; and
   encapsulating the first electrode and the second electrode.

2. The process as claimed in claim 1,
   wherein the foil structure comprises a laminate of at least one polymer and at least one metal; or
   wherein the foil structure is formed by the metal; or
   wherein the foil structure is formed by the polymer.

3. The process as claimed in claim 1, wherein the process further comprises:
   removing a surface layer of the foil structure to at least partly expose a metal of the foil structure, so that a metallic surface is formed.

4. The process as claimed in claim 1, wherein the process further comprises:
   coating of the foil structure using a further gaseous coating material;
   wherein a joint layer is formed using the gaseous coating material and the further gaseous coating material, with the gaseous coating material and the further gaseous coating material being at least partially mixed with one another.

5. The process as claimed in claim 1, wherein the process further comprises:
   generating energy pulses to heat the coating so that the latter is structurally altered.

6. The process as claimed in claim 1,
   wherein coating the foil structure comprises forming a contiguous microstructure covering at least a major part of the foil structure; and/or
   wherein coating the foil structure comprises forming a microstructure having strong chemical bonds to the foil structure.

7. The process as claimed in claim 1, further comprising:
   forming an energy storage, wherein the energy storage comprises the foil structure.

8. The process as claimed in claim 1,
   wherein encapsulating the first electrode and the second electrode forms an encapsulation, which surrounds the first electrode and the second electrode;
   wherein process further comprises:
   forming a first contact electrically connected to the foil structure, such that the first chemical potential is provided to the first contact, wherein the first contact is at least partially disposed outside the encapsulation.

9. The process as claimed in claim 1, further comprising:
   applying a further active material on a further foil structure to form the second electrode, which has the second chemical potential.

10. The process as claimed in claim 9,
    wherein the foil structure and the further foil structure are made from the same material.

11. The process as claimed in claim 1,
    wherein the foil structure is an aluminum foil.

12. The process as claimed in claim 1,
    wherein the protective layer comprises Titanium, Chromium, Aluminum, Copper, Nickel, Hafnium, Zirconium, Tantalum, Vanadium, Iron, Molybdenum, Niobium or Tungsten.

13. The process as claimed in claim 12,
    wherein the protective layer comprises a nitride of Chromium or a nitride of Niobium.

14. The process as claimed in claim 1,
    wherein the first electrode is an anode.

15. The process as claimed in claim 1,
    wherein the second chemical potential differs from the first chemical potential by at least 4 Volt.

16. The process as claimed in claim 1, further comprising:
    disposing an electrolyte between the first electrode and the second electrode, wherein the electrolyte comprises a fluid.

17. The process as claimed in claim 1,
    wherein the active material is applied on the foil structure by a wet chemical process.

18. The process as claimed in claim 1,
    coating of the foil structure using a further gaseous coating material, wherein the further gaseous coating material is formed from carbon.

19. A process comprising:
    transporting of a foil structure in a coating region in a vacuum chamber, wherein the foil structure has a thickness of less than 40 μm; and
    coating the foil structure with a protective layer using a gaseous coating material;
    wherein the gaseous coating material comprises a metal;
    applying an active material on the foil structure to form a first electrode which has a first chemical potential;
    assembly of the first electrode with a second electrode, where the second electrode has a second chemical potential; and
    encapsulating the first electrode and the second electrode to form an encapsulation which surrounds the first electrode and the second electrode;
    forming a first contact electrically connected to the foil structure, such that the first chemical potential is provided to the first contact, wherein the first contact is at least partially disposed outside the encapsulation.

20. A process comprising:
    transporting a first foil structure in a coating region in a vacuum chamber, wherein the first foil structure has a thickness of less than 40 μm; and
    coating the first foil structures with a protective layer using a gaseous coating material;
    wherein the gaseous coating material comprises a metal;
    applying a first active material on the first foil structure to form a first electrode which has a first chemical potential;

applying a second active material on a second foil structure to form a second electrode which has a second chemical potential;
assembly of the first electrode with the second electrode; and
encapsulating the first electrode and the second electrode.

\* \* \* \* \*